United States Patent
Yokoyama et al.

(10) Patent No.: US 9,449,814 B2
(45) Date of Patent: Sep. 20, 2016

(54) MANUFACTURING METHOD OF SEMICONDUCTOR DEVICE

(71) Applicant: Hitachi, Ltd., Chiyoda-ku, Tokyo (JP)

(72) Inventors: Natsuki Yokoyama, Mitaka (JP); Tomoyuki Someya, Fuchu (JP)

(73) Assignee: Hitachi, Ltd., Tokyo (JP)

( * ) Notice: Subject to any disclaimer, the term of this patent is extended or adjusted under 35 U.S.C. 154(b) by 482 days.

(21) Appl. No.: 13/874,468

(22) Filed: Apr. 30, 2013

(65) Prior Publication Data
US 2013/0244407 A1 Sep. 19, 2013

Related U.S. Application Data

(63) Continuation of application No. 12/268,538, filed on Nov. 11, 2008, now Pat. No. 8,445,352.

(30) Foreign Application Priority Data

Feb. 15, 2008 (JP) ................................ 2008-034699

(51) Int. Cl.
*H01L 21/331* (2006.01)
*H01L 21/02* (2006.01)
(Continued)

(52) U.S. Cl.
CPC ..... *H01L 21/02378* (2013.01); *H01L 29/6606* (2013.01); *H01L 29/66068* (2013.01); *H01L 29/7813* (2013.01); *H01L 29/7828* (2013.01); *H01L 29/8611* (2013.01); *H01L 29/872* (2013.01); *H01L 29/1608* (2013.01); *H01L 29/41766* (2013.01); *H01L 29/45* (2013.01); *H01L 29/513* (2013.01)

(58) Field of Classification Search
None
See application file for complete search history.

(56) References Cited

U.S. PATENT DOCUMENTS 6,214,107 B1 4/2001 Kitabatake
6,806,501 B2 10/2004 Vanhaelemeersch et al.
(Continued)

FOREIGN PATENT DOCUMENTS

JP 05-017229 A 1/1993
JP 10-199848 7/1998
(Continued)

OTHER PUBLICATIONS

Office Action mailed Feb. 7, 2012 in Japanese Patent Application No. 2008-034699 (and English translation).
(Continued)

*Primary Examiner* — Jack Chen
(74) *Attorney, Agent, or Firm* — Miles & Stockbridge P.C.

(57) ABSTRACT

A problem in the conventional technique is that metal contamination on a silicon carbide surface is not sufficiently removed in a manufacturing method of a semiconductor device using a monocrystalline silicon carbide substrate. Accordingly, there is a high possibility that the initial characteristics of a manufactured silicon carbide semiconductor device are deteriorated and the yield rate is decreased. Further, it is conceivable that the metal contamination has an adverse affect even on the long-term reliability of a semiconductor device. In a manufacturing method of a semiconductor device using a monocrystalline silicon carbide substrate, there is applied a metal contamination removal process, on a silicon carbide surface, including a step of oxidizing the silicon carbide surface and a step of removing a film primarily including silicon dioxide formed on the silicon carbide surface by the step.

14 Claims, 40 Drawing Sheets

(51) Int. Cl.
*H01L 29/66* (2006.01)
*H01L 29/78* (2006.01)
*H01L 29/861* (2006.01)
*H01L 29/872* (2006.01)
*H01L 29/16* (2006.01)
*H01L 29/417* (2006.01)
*H01L 29/45* (2006.01)
*H01L 29/51* (2006.01)

(56) References Cited

U.S. PATENT DOCUMENTS

| | | | |
|---|---|---|---|
| 7,473,929 B2 * | 1/2009 | Kusumoto | H01L 21/046 |
| | | | 257/288 |
| 7,696,103 B2 | 4/2010 | Shive et al. | |
| 7,820,534 B2 | 10/2010 | Sawada et al. | |
| 8,034,183 B2 | 10/2011 | Furui et al. | |
| 8,133,820 B2 | 3/2012 | Hirano | |
| 2007/0138482 A1 | 6/2007 | Tanimoto | |
| 2009/0042375 A1 * | 2/2009 | Sawada et al. | 438/522 |
| 2009/0209090 A1 | 8/2009 | Yokoyama et al. | |

FOREIGN PATENT DOCUMENTS

| | | |
|---|---|---|
| JP | 2003-59850 | 2/2003 |
| JP | 2003-146778 A | 5/2003 |
| JP | 2007-115875 | 5/2007 |
| JP | 2007-184571 | 7/2007 |
| JP | 2009-65112 | 3/2009 |
| WO | WO 2006/082724 A1 | 8/2006 |
| WO | WO 2007/077718 A1 | 7/2007 |
| WO | WO 2008/004513 A1 | 1/2008 |

OTHER PUBLICATIONS

Japanese Office Action dated Mar. 17, 2015, issued in counterpart Japanese Patent Application No. 2014-084416, with English translation.

Japanese Office Action dated Jun. 11, 2013, issued in counterpart Japanese Patent Application No. 2012-158519 (with full English translation).

* cited by examiner

FIG.2C (×10¹⁰ atoms/cm²)

TITANIUM:

|   | 0 |   |
|---|---|---|
| 0 | 0 | 0 |
|   | 0 |   |

CHROME:

|   | 0 |   |
|---|---|---|
| 0 | 0 | 0 |
|   | 0 |   |

IRON:

|   | 0 |   |
|---|---|---|
| 0 | 0 | 0.23 |
|   | 0 |   |

NICKEL:

|   | 0 |   |
|---|---|---|
| 0 | 0 | 0 |
|   | 0 |   |

COPPER:

|   | 0.19 |   |
|---|------|---|
| 0 | 0 | 0.11 |
|   | 0 |   |

ZINC:

|   | 0 |   |
|---|---|---|
| 0 | 0 | 0 |
|   | 0 |   |

FIG.3

($\times 10^{10}$ atoms/cm$^2$)

TITANIUM:

|  | 0 |  |
|---|---|---|
| 0 | 0 | 0 |
|  | 0 |  |

CHROME:

|  | 0 |  |
|---|---|---|
| 0 | 0 | 0 |
|  | 0.26 |  |

IRON:

|  | 3.21 |  |
|---|---|---|
| 15.11 | 3.74 | 2.76 |
|  | 5.92 |  |

NICKEL:

|  | 0 |  |
|---|---|---|
| 0 | 0 | 0 |
|  | 0 |  |

COPPER:

|  | 607.7 |  |
|---|---|---|
| 607.1 | 441.4 | 539.2 |
|  | 706.9 |  |

ZINC:

|  | 0 |  |
|---|---|---|
| 0 | 0 | 0 |
|  | 0 |  |

FIG.6

($\times 10^{10}$ atoms/cm$^2$)

TITANIUM:

|  | 2.5 |  |
|---|---|---|
| 5.5 | 0.29 | 12.3 |
|  | 30.8 |  |

CHROME:

|  | 0 |  |
|---|---|---|
| 0 | 2.88 | 1.58 |
|  | 1.26 |  |

IRON:

|  | 816 |  |
|---|---|---|
| 507 | 294 | 199 |
|  | 356 |  |

NICKEL:

|  | 3.13 |  |
|---|---|---|
| 15.8 | 2.72 | 37.3 |
|  | 1.28 |  |

COPPER:

|  | 4.76 |  |
|---|---|---|
| 0.38 | 5.88 | 7.81 |
|  | 11.9 |  |

ZINC:

|  | 42.2 |  |
|---|---|---|
| 48.4 | 51.4 | 57.8 |
|  | 11.3 |  |

F I G . 7

($\times 10^{10}$ atoms/cm$^2$)

TITANIUM:

|   | 0 |   |
|---|---|---|
| 0 | 0 | 0 |
|   | 0 |   |

CHROME:

|   | 0 |   |
|---|---|---|
| 0 | 0 | 0 |
|   | 0 |   |

IRON:

|     | 152 |      |
|-----|-----|------|
| 145 | 186 | 90.8 |
|     | 158 |      |

NICKEL:

|   | 0 |   |
|---|---|---|
| 0 | 0 | 0 |
|   | 0 |   |

COPPER:

|   | 0 |   |
|---|---|---|
| 0 | 0 | 0 |
|   | 0 |   |

ZINC:

|   | 5.64 |      |
|---|------|------|
| 0 | 6.25 | 1.07 |
|   | 2.62 |      |

FIG.8

($\times 10^{10}$ atoms/cm$^2$)

TITANIUM:

|  | 0 |  |
|---|---|---|
| 0 | 0 | 0 |
|  | 0 |  |

CHROME:

|  | 0 |  |
|---|---|---|
| 0 | 0 | 0 |
|  | 0 |  |

IRON:

|  | 135 |  |
|---|---|---|
| 140 | 120 | 101 |
|  | 113 |  |

NICKEL:

|  | 0 |  |
|---|---|---|
| 0 | 0 | 0 |
|  | 0 |  |

COPPER:

|  | 0 |  |
|---|---|---|
| 0 | 0 | 0 |
|  | 0 |  |

ZINC:

|  | 5.32 |  |
|---|---|---|
| 7.25 | 6.45 | 1.87 |
|  | 2.22 |  |

FIG. 9

($\times 10^{10}$ atoms/cm$^2$)

TITANIUM:

|  | 0 |  |
|---|---|---|
| 0 | 0 | 0 |
|  | 0 |  |

CHROME:

|  | 0 |  |
|---|---|---|
| 0 | 0 | 0 |
|  | 0 |  |

IRON:

|  | 0.21 |  |
|---|---|---|
| 0.13 | 0 | 0 |
|  | 0 |  |

NICKEL:

|  | 0 |  |
|---|---|---|
| 0 | 0 | 0 |
|  | 0 |  |

COPPER:

|  | 0 |  |
|---|---|---|
| 0 | 0 | 0 |
|  | 0 |  |

ZINC:

|  | 0.16 |  |
|---|---|---|
| 0 | 0 | 0 |
|  | 0 |  |

FIG.10

($\times 10^{10}$ atoms/cm$^2$)

TITANIUM:

|  | 0 |  |
|---|---|---|
| 0 | 0 | 0 |
|  | 0 |  |

CHROME:

|  | 0 |  |
|---|---|---|
| 0 | 0 | 0 |
|  | 0 |  |

IRON:

|  | 98.7 |  |
|---|---|---|
| 101 | 111 | 62.3 |
|  | 98.6 |  |

NICKEL:

|  | 0 |  |
|---|---|---|
| 0 | 0 | 0 |
|  | 0 |  |

COPPER:

|  | 0 |  |
|---|---|---|
| 0 | 0 | 0 |
|  | 0 |  |

ZINC:

|  | 4.75 |  |
|---|---|---|
| 4.76 | 5.37 | 3.12 |
|  | 2.54 |  |

MANUFACTURING METHOD OF SEMICONDUCTOR DEVICE

CLAIM OF PRIORITY

The present application claims priority from Japanese patent application JP 2008-034699 filed on Feb. 15, 2008, the content of which is hereby incorporated by reference into this application.

BACKGROUND OF THE INVENTION

1. Field of the Invention

The present invention relates to a manufacturing method of a semiconductor device using a monocrystalline silicon carbide substrate.

2. Description of the Related Arts

A conventional power semiconductor device (power semiconductor device) has been manufactured by using a monocrystalline silicon substrate. The progress of design and manufacturing techniques of elements has reduced resistance (on-resistance) at the time of applying current while keeping a high breakdown voltage to realize low loss. However, the breakdown voltage and on-resistance have a trade-off relation in which they are determined on the basis of a band gap of the material of a substrate, and thus, there is a limit to improvement of performance as long as the conventional silicon is used. Therefore, as a material in place of silicon, a wide-gap semiconductor such as silicon carbide and gallium nitride has attracted attention. Use of the wide-gap semiconductor can realize a high-performance power semiconductor device as compared to use of silicon. In particular, development of a power semiconductor device using silicon carbide has been increasing. The first reason is that the high quality and large diameter of a monocrystalline silicon carbide substrate have been realized, and it is relatively easy to obtain a substrate necessary for manufacturing a semiconductor device. The second reason is that n-type and p-type conductive areas can be easily formed on a monocrystalline silicon carbide substrate by epitaxial growth and ion implantation, and a film primarily including silicon dioxide can be formed thereon by thermal oxidation. Accordingly, there has been a possibility that various power semiconductor devices can be manufactured. As a switching element, there have been studied, so far, a BJT (Bipolar Junction Transistor), in addition to a unipolar element such as an MOSFET (Metal Oxide Semiconductor Field Effect Transistor) and a JFET (Junction Field Effect Transistor). Further, as a rectifying device, a p-n junction diode and a Schottky barrier diode have been developed. In particular, for high breakdown voltage, a diode element called JBS (Junction Barrier Schottky) obtained by combining a p-n junction diode and a Schottky barrier diode has been developed.

SUMMARY OF THE INVENTION

In the manufacturing of a power semiconductor device using a monocrystalline silicon carbide substrate, many of manufacturing techniques accumulated in the manufacturing of a silicon semiconductor device can be applied. However, it is necessary to develop new techniques for silicon carbide in a part of the manufacturing techniques. It is said, in general, that a manufacturing technique of a monocrystalline silicon carbide substrate, a processing technique of silicon carbide, a formation technique of a silicon carbide epitaxial layer, a high-temperature ion implantation technique, an activation technique of impurities, a formation technique of ohmic contact, a formation technique of an MOSFET gate insulating film, and the like correspond to the new techniques. However, the inventors have found that use of a technique established for silicon is inadequate even in a cleaning technique, and a technique specialized in silicon carbide is necessary. In particular, it has been found that even if metal contamination removal in the manufacturing method for a silicon semiconductor is applied, as it is, to that for a silicon carbide semiconductor, sufficient effects can not be obtained.

In the manufacturing of a silicon semiconductor device, many of cleaning processes in a chemical liquid are used. A film primarily including silicon dioxide is formed on a surface of silicon in an oxidized chemical liquid such as an ammonia-hydrogen peroxide solution mixture, a sulfuric acid-hydrogen peroxide solution mixture, a hydrofluoric acid-hydrogen peroxide solution mixture, and nitric acid. Along with the formation of the oxidized film, metal elements existing on the surface of silicon emerge on the oxidized film, or drawn in the oxidized film in many cases. If the oxidized film is removed in a hydrofluoric acid aqueous solution after oxidation, the metal elements on or in the oxidized film are simultaneously removed.

In the conventional manufacturing method of a semiconductor device using a monocrystalline silicon carbide substrate, cleaning processes in a chemical liquid used for manufacturing of a silicon semiconductor device are used while being appropriately combined to each other. However, if a monocrystalline silicon carbide substrate is dipped into a chemical liquid for oxidizing silicon, the film primarily including silicon dioxide is barely formed, which is different from the case of a silicon substrate. Therefore, it is conceivable that a mechanism by which the metal elements are removed due to the formation of the above-described oxidized film is not realized. In a silicon substrate, silicon itself can be etched by hydrofluoric nitric acid or the like. However, only a special chemical liquid such as a molten potassium hydroxide enables etching of silicon carbide. Accordingly, it is impossible to apply a method in which silicon carbide itself is etched in a chemical liquid so as to simultaneously remove the metal elements.

For a silicon carbide sintered body, some cleaning methods have been devised. A method of using blast cleaning by silica abrasive grain is described in, for example, Japanese Patent Application Laid-Open No. H5-17229. However, due to introduction of damages such as defects caused by blast cleaning, it is impossible to apply the method, as it is, to cleaning of a monocrystalline silicon carbide substrate used for manufacturing of a semiconductor device. Further, a method of cleaning by exposing a sintered body to plasma is described in Japanese Patent Application Laid-Open No. 2003-146778. It is described that any plasma generation gas may be used unless it reacts with silicon carbide, and a cleaning mechanism is physical contamination removal by plasma. Accordingly, a large power is required for plasma generation and a period during which the sintered body is exposed to plasma is long. This method also causes damages to the substrate, and thus, it is impossible to apply the method, as it is, to cleaning of a monocrystalline silicon carbide substrate used for manufacturing of a semiconductor device. It is conceivable that both methods are effective only in a silicon carbide sintered body used for a member of a semiconductor manufacturing device or used as a dummy substrate.

Although the diffusion coefficient of metal in monocrystalline silicon carbide is small, it is undeniable that metal is possibly captured in defects in monocrystalline to cause reduction in breakdown voltage and deterioration in long-term reliability. Further, the metal elements drawn in a gate insulating film and an interlayer insulating film primarily including silicon dioxide are easily diffused. It can be easily presumed that the metal elements have an adverse affect on the initial characteristics and long-term reliability of a gate insulating film and an interlayer insulating film. It has been found that metal contamination has an adverse affect on the initial characteristics of a manufactured element to decrease the yield rate and to deteriorate the long-term reliability in a silicon semiconductor device. It is conceivable that the metal contamination has the same adverse affect even on a silicon carbide semiconductor device. There has been desired development of an effective metal contamination removal method that can be applied to manufacturing of a semiconductor device using a monocrystalline silicon carbide substrate.

A problem in the conventional technique to be solved is that metal contamination on a silicon carbide surface is not sufficiently removed in a manufacturing method of a semiconductor device using a monocrystalline silicon carbide substrate. Accordingly, there is a high possibility that the initial characteristics of a manufactured silicon carbide semiconductor device are deteriorated and the yield rate is decreased. Further, it is conceivable that the metal contamination has an adverse affect even on the long-term reliability of a semiconductor device.

The main aspect of the present invention is a manufacturing method of a semiconductor device including a metal contamination removal process for removing metal contamination on a surface of a monocrystalline silicon carbide substrate, wherein the metal contamination removal process includes: a thin film formation process for forming a film primarily including silicon dioxide on a surface of the monocrystalline silicon carbide substrate by oxidizing the surface of the monocrystalline silicon carbide substrate; and a thin film removal process for removing the film primarily including silicon dioxide.

By exposing a substrate to oxygen plasma, a thin film primarily including silicon dioxide is formed on a surface of the substrate. Metal elements existing on a surface of a substrate emerge on the oxidized film, or drawn in the oxidized film in many cases. If the oxidized film is removed in a hydrofluoric acid aqueous solution, the metal elements on or in the oxidized film are simultaneously removed. Accordingly, the surface of silicon carbide can be cleaned.

BRIEF DESCRIPTION OF THE DRAWINGS

FIG. 2C is a diagram showing an analysis result of the metal contamination explained in the first embodiment of the present invention;

FIG. 3 is a diagram showing an analysis result of the metal contamination explained in the first embodiment of the present invention;

FIG. 6 is a diagram showing an analysis result of metal contamination explained in a second embodiment of the present invention;

FIG. 7 is a diagram showing an analysis result of the metal contamination explained in the second embodiment of the present invention;

FIG. 8 is a diagram showing an analysis result of the metal contamination explained in the second embodiment of the present invention;

FIG. 9 is a diagram showing an analysis result of the metal contamination explained in the second embodiment of the present invention;

FIG. 10 is a diagram showing an analysis result of the metal contamination explained in the second embodiment of the present invention;

DETAILED DESCRIPTION OF THE PREFERRED EMBODIMENTS

Hereinafter, embodiments of the present invention will be described in detail using the drawings.

A metal contamination removal process in which by exposing a surface of a monocrystalline silicon carbide substrate to oxygen plasma, a film having a thickness of less than 5 nm primarily including silicon dioxide is formed on the surface of the monocrystalline silicon carbide substrate, and the film primarily including silicon dioxide formed on the surface of the monocrystalline silicon carbide substrate is removed by dipping the substrate into an etching solution containing hydrofluoric acid is applied to a manufacturing method of a semiconductor device using the monocrystalline silicon carbide substrate. Accordingly, the initial characteristics of a semiconductor device to be manufactured are improved, and the yield rate is increased. Further, the long-term reliability is also improved.

First Embodiment

Figure 1:
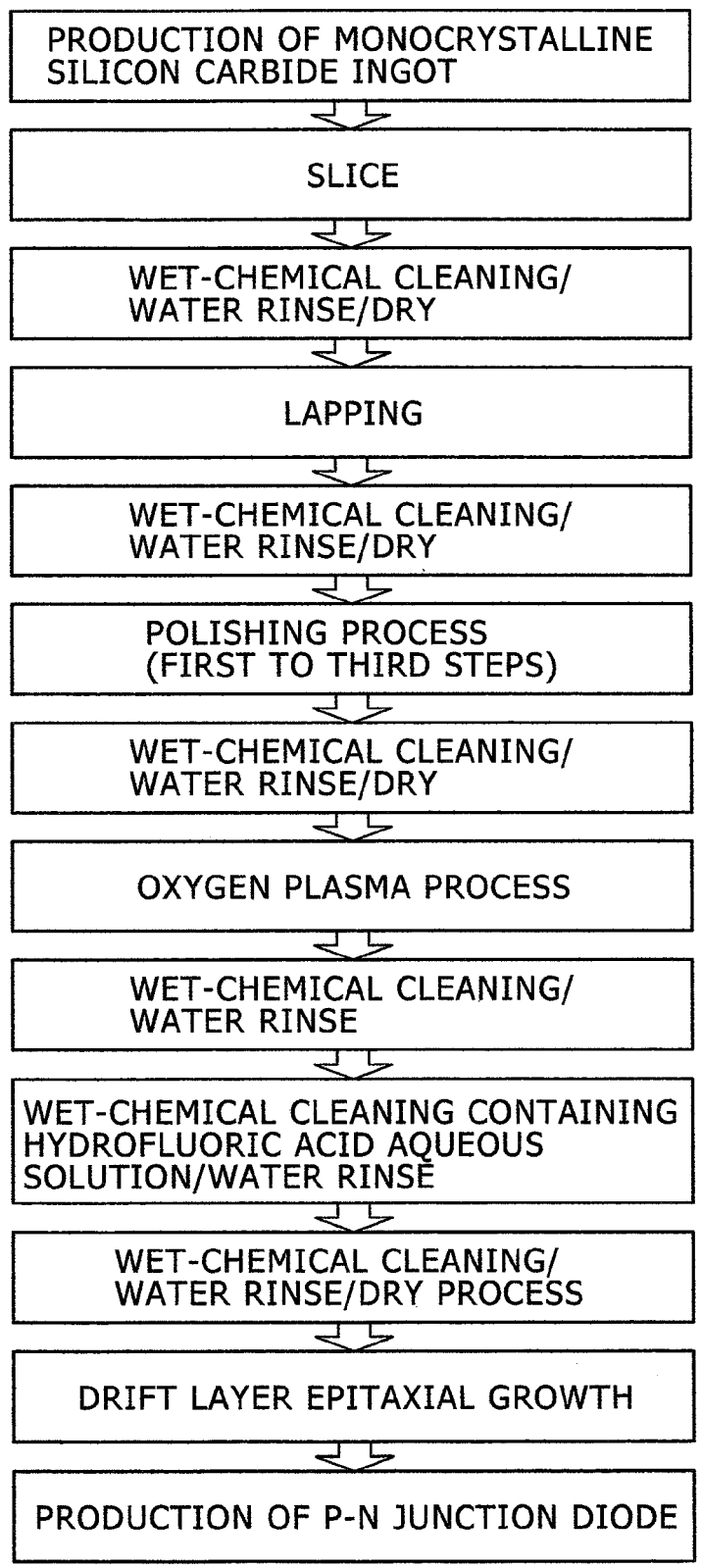
FIG. 1 is a diagram for explaining an embodiment of the present invention.

A first embodiment will be described using FIGS. 1 to 6. The first embodiment is an embodiment applied to manufacturing of a p-n junction diode. In FIG. 1, a process flow of a manufacturing method of a p-n junction diode according to the present invention is shown. In the first place, an ingot made of monocrystalline silicon carbide (4H—SiC) was produced in order to manufacture the monocrystalline silicon carbide substrate. In the manufacturing of the ingot, there was used a sublimation method that is currently the most common method. However, another monocrystalline silicon carbide growth technique such as a dissolution method may be used. As monocrystalline, monocrystalline silicon carbide having other crystal forms such as 2H—SiC, 6H—SiC, and 3C—SiC can be used, in addition to 4H—SiC. $3 \times 10^{18}$ cm$^{-3}$ of nitrogen was contained in monocrystalline silicon carbide of the ingot, and the ingot was of a high-concentration n-type. Next, the produced ingot was sliced to obtain monocrystalline substrates in a thin-plate shape. This process is generally called a slice process. The ingot was sliced so as to form a monocrystalline substrate with a (0001) plane with 4° off-angle inclined toward [11-20]. The ingot may be sliced to form a (000-1) plane or a (11-20) plane serving as front surfaces, in place of the (0001) plane. The off-angle is not limited to 4°, but may be in the range of about 0 to 8°. The diameter was 76.2 mm at the most, and primary and secondary orientation flats were formed. The diameter is not limited to 76.2 mm, but may be other dimensions.

Next, the sliced substrate was lapped to have an appropriate thickness by a lapping process. In place of the lapping process, a polishing process may be used. Thereafter, a front surface and a back surface of the lapped substrate were polished for flat and mirror finish by a polishing process. As a polishing method, CMP (Chemical Mechanical Polishing) was applied. In the first embodiment, defects and flaws introduced to the substrate in the slice process and the lapping process were also removed in the polishing process. However, a damaged layer of the surface may be removed by adding a special process such as dry etching using plasma, as needed. In this case, these processes are inserted before or after the polishing process. The polishing by CMP was performed in different three steps. By selecting of slurry and polishing conditions, the flatness of the front surface of the substrate was gradually increased, and the mirrored surface was formed in the third polishing step. The polishing of the back surface of the substrate was performed in different two steps under the conditions different from those of the front surface. The thickness of the substrate after polishing was 350 μm, but may be other dimensions. During the processes between the slice process and the polishing process, a wet-chemical cleaning/water rinse/dry process was appropriately performed for removing organic substances and metal contamination attached to the substrate. The metal contamination removal process of the present invention was applied after the polishing process to realize the final cleaning. The front and back surfaces of the monocrystalline silicon carbide substrate after polishing were exposed to oxygen plasma for oxidation, and then, the substrate was dipped into an etching solution containing hydrofluoric acid to remove the oxidized film.

The metal contamination removal process after polishing will be described in detail. The oxygen plasma process was performed using a micro-wave plasma etching system. The process was performed under the conditions of an oxygen flow rate of 200 sccm, a pressure of 5 Pa in a reaction chamber, a micro-wave source power of 800 W, and an RF bias power of 5 W, and the duration was 60 seconds for each of the front and back surfaces. Each electrode of the system was shaped in a circular form with a diameter of about 200 mm. Thus, the RF bias power per unit area was 0.016 W/cm$^2$. In the first place, the front surface of the monocrystalline silicon carbide substrate was processed while the front surface was directed upward. Next, the back surface of the monocrystalline silicon carbide substrate was processed while the back surface was directed upward. Films primarily including silicon dioxide were formed on the front and back surfaces of the monocrystalline silicon carbide substrate by the oxygen plasma process. The measurement of the thickness of each film primarily including silicon dioxide formed on the surface made of silicon showed less than 2 nm.

After the oxygen plasma process, the monocrystalline silicon carbide substrate was dipped into aqua regia for 180 seconds, and was, after water rinse, dipped into a sulfuric acid-hydrogen peroxide solution mixture kept at 120° C. for 180 seconds. The mixture ratio of sulfuric acid and hydrogen peroxide solution (31% aqueous solution) was 7:3. After water rinse, the monocrystalline silicon carbide substrate was dipped into a hydrofluoric acid aqueous solution for 180 seconds. The mixture ratio of hydrofluoric acid (55% aqueous solution) and water was 1:20. By dipping into a hydrofluoric acid aqueous solution, the films primarily including silicon dioxide formed on the frond and back surfaces of the monocrystalline silicon carbide substrate were removed by the oxygen plasma process. Finally, the monocrystalline silicon carbide substrate was dipped into an ammonia-hydrogen peroxide solution mixture for 120 seconds, rinsed by water, and dried by a spin drier. For comparison, a monocrystalline silicon carbide substrate according to a conventional manufacturing method was produced. The processes between the process of slicing the ingot and the process of polishing the front and back surfaces by CMP of the conventional manufacturing method are the same as those according to the manufacturing method of the monocrystalline silicon carbide substrate in the first embodiment of the present invention. A conventional metal contamination removal process was applied after the polishing process for the final cleaning. Specifically, different from the present invention, only wet-chemical cleaning in each of aqua regia, a sulfuric acid-hydrogen peroxide solution mixture, a hydrofluoric acid aqueous solution, and an ammonia-hydrogen peroxide solution mixture was performed for the substrate without performing the process of exposing the substrate to oxygen plasma. The components of the chemical liquid used and the cleaning conditions were the same as those of the monocrystalline silicon carbide substrate according to the first embodiment of the present invention.

Figure 2A:
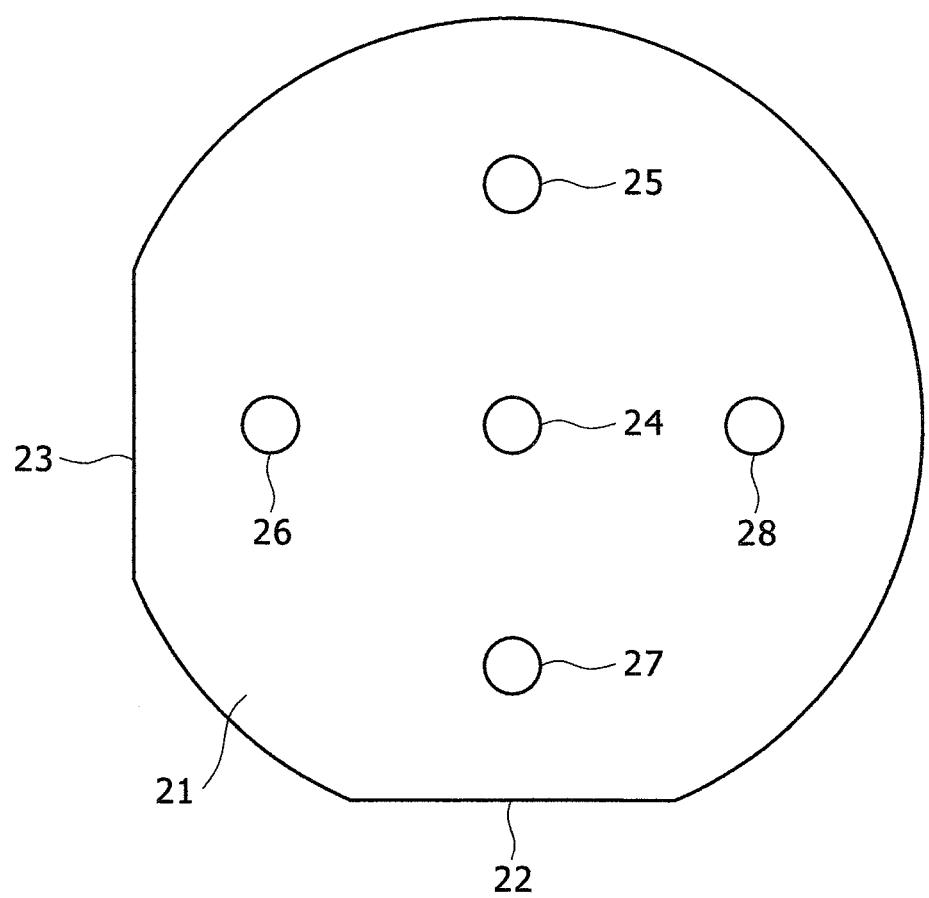
FIG. 2A is a diagram showing measurement spots of a monocrystalline silicon carbide substrate explained in a first embodiment of the present invention.
Figure 2B:
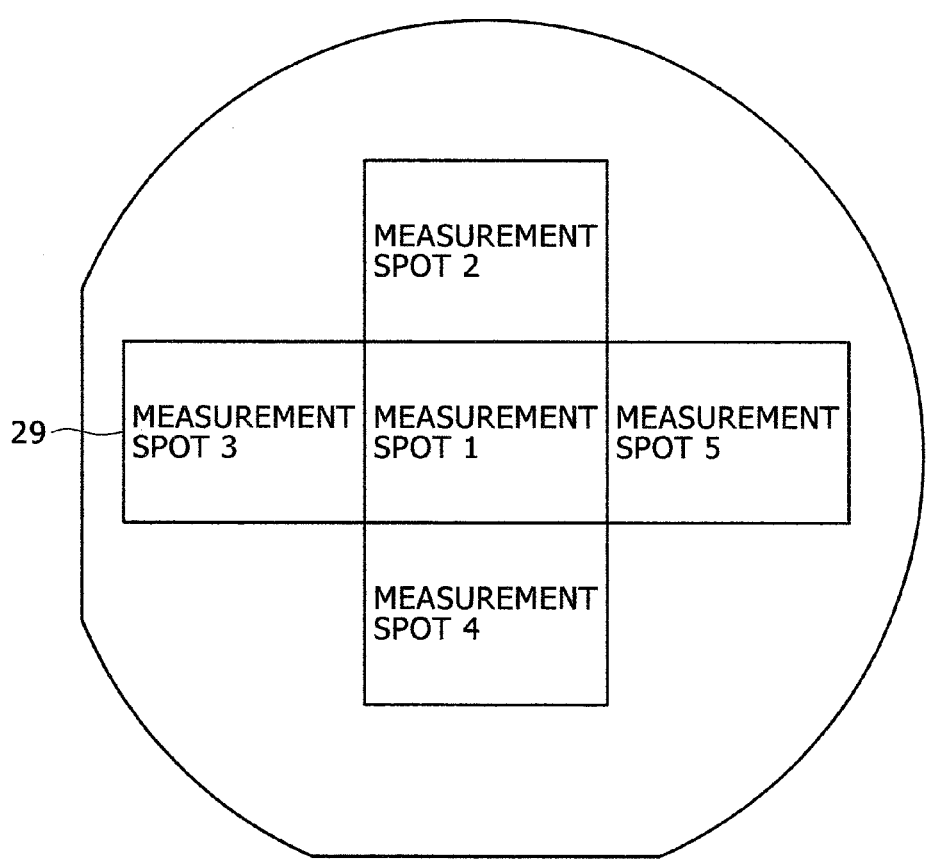
FIG. 2B is a diagram showing measurement spots of metal contamination explained in the first embodiment of the present invention.

FIG. 2C shows a result obtained by analyzing the metal contamination of the surface of the monocrystalline silicon carbide substrate of the first embodiment to which the present invention was applied. FIG. 3 shows a result obtained by analyzing the metal contamination of the surface of the monocrystalline silicon carbide substrate according to the conventional manufacturing method. The analysis was conducted by TRXRF (Total Reflection X-Ray Fluorescence) analysis, and 5 spots on the surface of the substrate were measured in terms of titanium, chromium, iron, nickel, copper, and zinc. A primary orientation flat 22 and a secondary orientation flat 23 were formed on the surface of a monocrystalline silicon carbide substrate 21 of FIG. 2A. As shown in FIG. 2B, a center 24 was a measurement spot 1. Measurement spots 2, 3, 4, and 5 were uniformly arranged on a circle, having a diameter of 20 mm, with the measurement spot 1 as its center. It should be noted that the measurement spots 1 to 5 corresponded to the reference numerals 24, 25, 26, 27, and 28 on a wafer surface of FIG. 2A, respectively. In a format shown by the reference numeral 29 of FIG. 2B, the surface concentration of each metal element at each measurement spot was shown. The concentration was shown by "×10$^{10}$ atoms/cm$^2$" as shown in the drawing. A control reference value was shown by "3×10$^{10}$ atoms/cm$^2$".

FIG. 3 also shows the surface concentration of each metal element at the same measurement spots as those in FIG. 2C and in the same format as that of FIG. 2C. As shown in FIG. 3, the elements of iron and copper remained on the surface of the substrate according to the conventional manufacturing method. However, as being apparent from FIG. 2C, there existed all the elements including iron and copper on the surface of the substrate according to the manufacturing method of the present invention only in the number of the control reference value limit or less. It is unclear at which stage the iron and copper were attached to the surface of the substrate. The contamination caused by tools used in the slice process and the lapping process, and the slurry used in the polishing process are suspected. It is conceivable that the difference of the remaining metal contamination depended on whether or not the surface of the monocrystalline silicon carbide substrate was oxidized.

Specifically, in the case of the manufacturing method of the present invention, by exposing the substrate to oxygen plasma, the thin films primarily including silicon dioxide are formed on the surfaces of substrate. The metal elements existing on the surfaces of the substrate emerge on the oxidized films or are drawn into the oxidized films in many cases. When the oxidized films are removed in a hydrofluoric acid aqueous solution, the metal elements on or in the oxidized films are simultaneously removed. The conventional manufacturing method is one to which the manufacturing method of a silicon semiconductor device is diverted. Unlike the case of a monocrystalline silicon substrate, even if the monocrystalline silicon carbide substrate is dipped into a chemical liquid containing hydrogen peroxide, the films primarily including silicon dioxide are barely formed. Therefore, it is conceivable that a mechanism by which the metal elements are removed by forming the oxidized films is not realized.

In the first embodiment, the metal contamination removal process of the present invention was applied after the monocrystalline silicon carbide substrate itself was polished by CMP. However, it is advantageous if the metal contamination removal process of the present invention is applied after the silicon dioxide films and polysilicon films are polished during the manufacturing of the device. As similar to the first embodiment, the same effect of removing the metal contamination can be obtained.

In order to apply the monocrystalline silicon carbide substrate manufactured in the above-described manner to production of a power device, a silicon carbide n-type epitaxial layer containing nitrogen was formed on the surface of the substrate as a drift layer (electric field relaxation layer). Two substrates including one according to the manufacturing method of the present invention and the other according to the conventional manufacturing method were set to an epitaxial growth system, a hydrogen flow rate was adjusted to 10 slm, and a pressure in a reaction chamber was set at 10 kPa. The substrates were heated to 1400° C. by high-frequency induction heating, and maintained for 10 minutes. At this time, the surfaces of the substrates were etched, and damaged layers containing defects and flaws that were introduced and remained at the time of processing the substrates were removed. After the temperature of the substrates was raised to 1500° C., in addition to 10 slm of hydrogen, 0.6 sccm of propane, 2.5 sccm of silane, and 0.2 sccm of nitrogen were simultaneously supplied to the reaction chamber. After this state was maintained for 140 minutes, the supplying of propane, silane and nitrogen and the heating were stopped, and the substrates were cooled in hydrogen. After a certain period of time, two monocrystalline silicon carbide substrates were taken out, and the concentrations and thicknesses of the epitaxial layers were measured. The concentration of nitrogen in each of four epitaxial layers was $2 \times 10^{16}$ cm$^{-3}$ and the thickness thereof was 8 μm.

The number of epitaxy defects such as comet defects and carrot defects was visually counted by observing the surfaces of the substrates with an optical microscope. It was found that the density of the epitaxy defects in the monocrystalline silicon carbide substrate according to the manufacturing method of the present invention was reduced to about 60% of that of the monocrystalline silicon carbide substrate according to the conventional manufacturing method. Next, for each of the substrate according to the manufacturing method of the present invention and the substrate according to the conventional manufacturing method, an etch pit was formed using a potassium hydroxide melt, and basal-plane dislocation densities were compared to each other. This method is well known as an observation method of dislocation. The basal-plane dislocation density of the epitaxial layer on the monocrystalline silicon carbide substrate according to the manufacturing method of the present invention was 260 cm$^{-2}$, whereas that according to the conventional manufacturing method was 380 cm$^{-2}$. The basal-plane dislocation density of the monocrystalline silicon carbide substrate according to the present invention was reduced by about 30%, as compared to that according to the conventional manufacturing method.

Figure 4A:
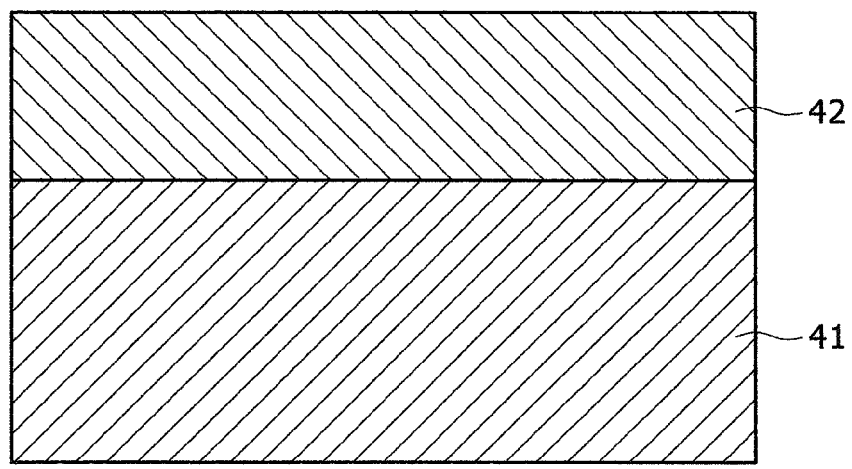
FIG. 4A is a cross sectional view showing a manufacturing process of a p-n junction diode of the first embodiment.
Figure 4B:
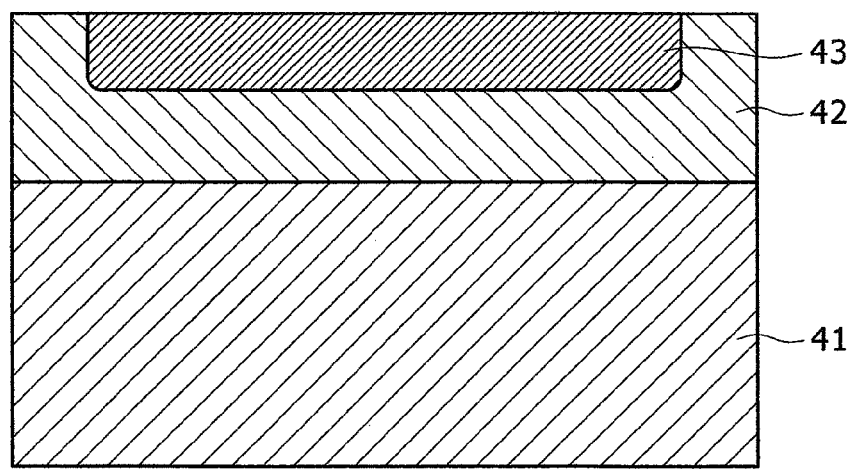
FIG. 4B is a cross sectional view showing a manufacturing process of the p-n junction diode of the first embodiment.

P-n diodes were produced by using the substrate according to the manufacturing method of the present invention on which the n-type epitaxial layer was formed and the substrate according to the conventional manufacturing method for comparison. FIGS. 4A to 4F are cross sectional views each showing a manufacturing process of the p-n junction diode of the first embodiment. A termination area for relaxing the electric field was formed around the p-n junction diode. However, the illustration of the termination area is omitted in each of FIGS. 4A to 4F. As shown in FIG. 4F, the p-n junction diode of the first embodiment includes an n-type drift layer 42 containing nitrogen which is formed on a main surface of a monocrystalline silicon carbide substrate 41 and has a thickness of 8 μm, a p-type doped layer 43 containing aluminum which is formed on a part of a surface of the drift layer 42 and has a thickness of about 0.5 μm, and a high-concentration p-type layer 44 containing aluminum which is formed on a surface of the p-type doped layer 43 and has a thickness of 0.1 μm. The nitrogen concentrations (donor concentrations) of the monocrystalline silicon carbide substrate 41 and the n-type drift layer 42 were $3 \times 10^{18}$ cm$^{-3}$ and $2 \times 10^{16}$ cm$^{-3}$, respectively. The aluminum concentrations (acceptor concentrations) of the p-type doped layer 43 and the high-concentration p-type layer 44 were $2 \times 10^{18}$ cm$^{-3}$ and $5 \times 10^{19}$ cm$^{-3}$, respectively. As shown in FIG. 4B, ion implantation of aluminum was performed on a part of the surface of the drift layer 42 to form the p-type doped layer 43.

Figure 4C:
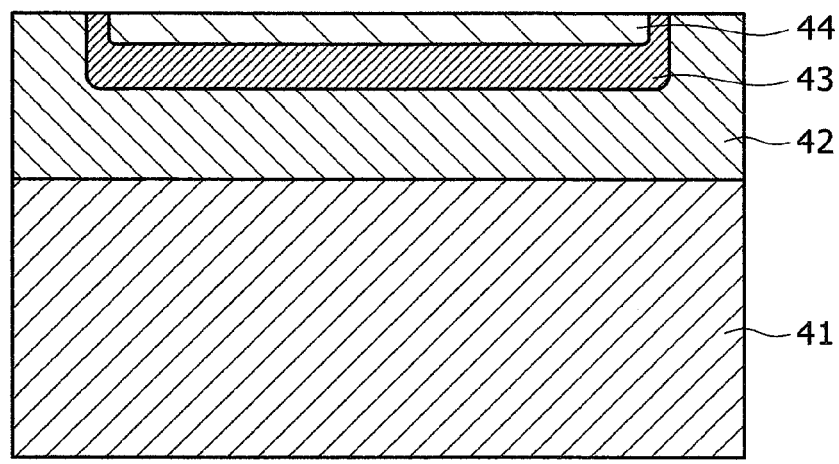
FIG. 4C is a cross sectional view showing a manufacturing process of the p-n junction diode of the first embodiment.
Figure 4D:
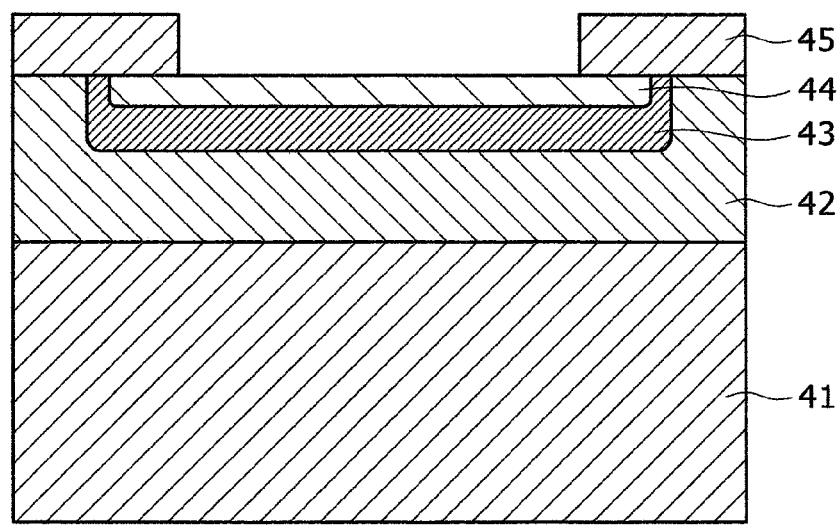
FIG. 4D is a cross sectional view showing a manufacturing process of the p-n junction diode of the first embodiment.
Figure 4E:
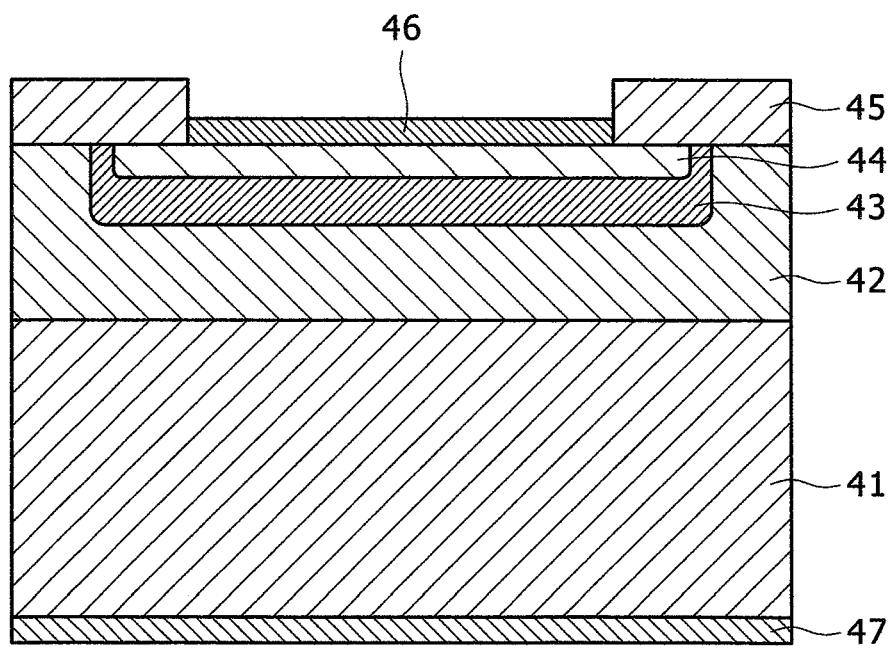
FIG. 4E is a cross sectional view showing a manufacturing process of the p-n junction diode of the first embodiment.
Figure 4F:
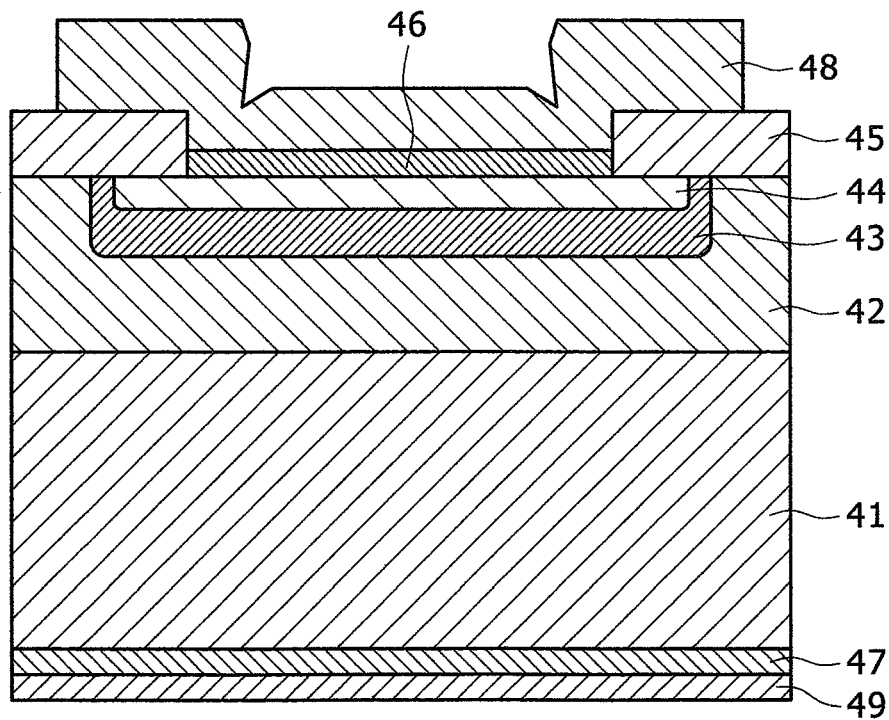
FIG. 4F is a cross sectional view showing a manufacturing process of the p-n junction diode of the first embodiment.
Figure 4G:
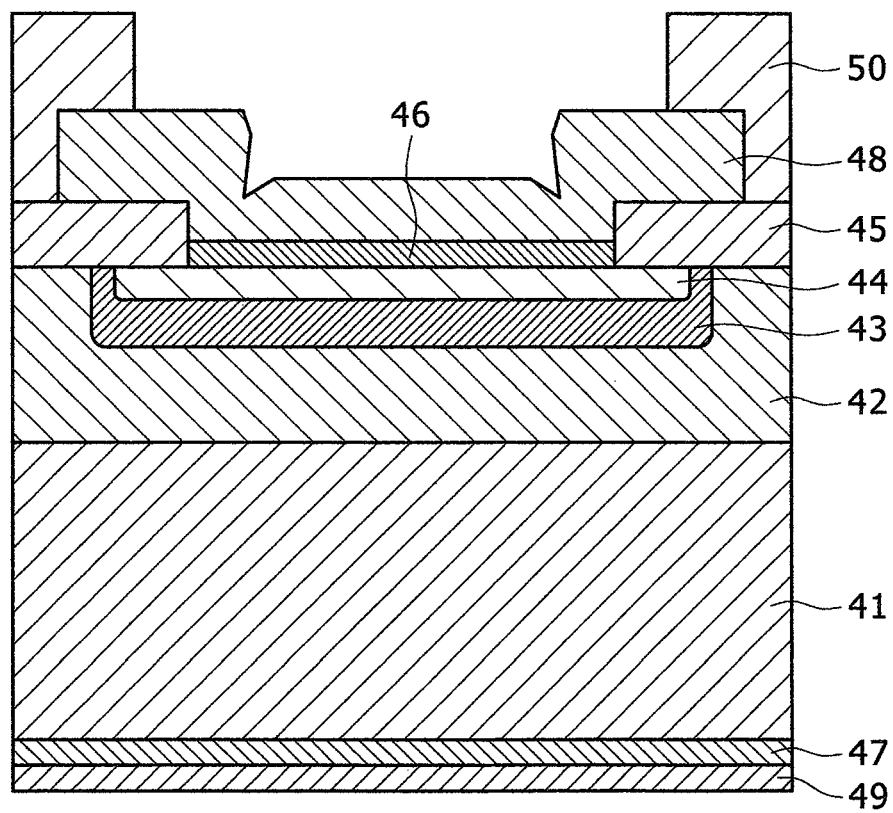
FIG. 4G is a cross sectional view showing a manufacturing process of the p-n junction diode of the first embodiment.

Next, ion implantation of aluminum was performed on the surface of the p-type doped layer 43 so as to have a concentration higher than that of the drift layer 42 and the high-concentration p-type layer 44 was formed, as shown in FIG. 4C. After the ion implantation on the p-type doped layer 43 and the high-concentration p-type layer 44, an activation annealing process was carried out at 185° C. for one minute in an argon atmosphere. Thereafter, as shown in FIG. 4D, a silicon dioxide film 45 was formed by a plasma CVD (Chemical Vapor Deposition) method and an opening for an electrode of the diode was formed. Next, nickel films, each having a thickness of 50 nm, were formed on the front and back surfaces by using a sputtering system, and a annealing process was carried out at 800° C. for one minute in an argon atmosphere by using an RTA (Rapid Thermal Anneal) system. After a certain period of time, when the monocrystalline silicon carbide substrate 41 was dipped into an ammonia-hydrogen peroxide solution mixture to remove unreacted nickel films, layers 46 and 47 primarily including nickel silicide were formed on the surface of the monocrystalline silicon carbide substrate at the opening portion and on the back surface, respectively, as shown in FIG. 4E. Then, a heating process was again carried out at 1000° C. for one minute in an argon atmosphere by using the RTA system. As shown in FIG. 4F, an aluminum electrode 48 having a thickness of 3 μm was formed on the front surface side. An aluminum film was formed by using the sputtering system, and was patterned by a well-known lithography process and a wet etching technique. On the back surface, a nickel film 49, serving as a back-surface electrode, having a thickness of 100 nm was formed by the sputtering system. Finally, a passivation film 50 made of polyimide resin was formed and an opening was formed on the aluminum film 48 of the diode electrode. As described above, the p-n junction diode of the first embodiment was produced by the manufacturing method of the present invention.

Figure 5A:
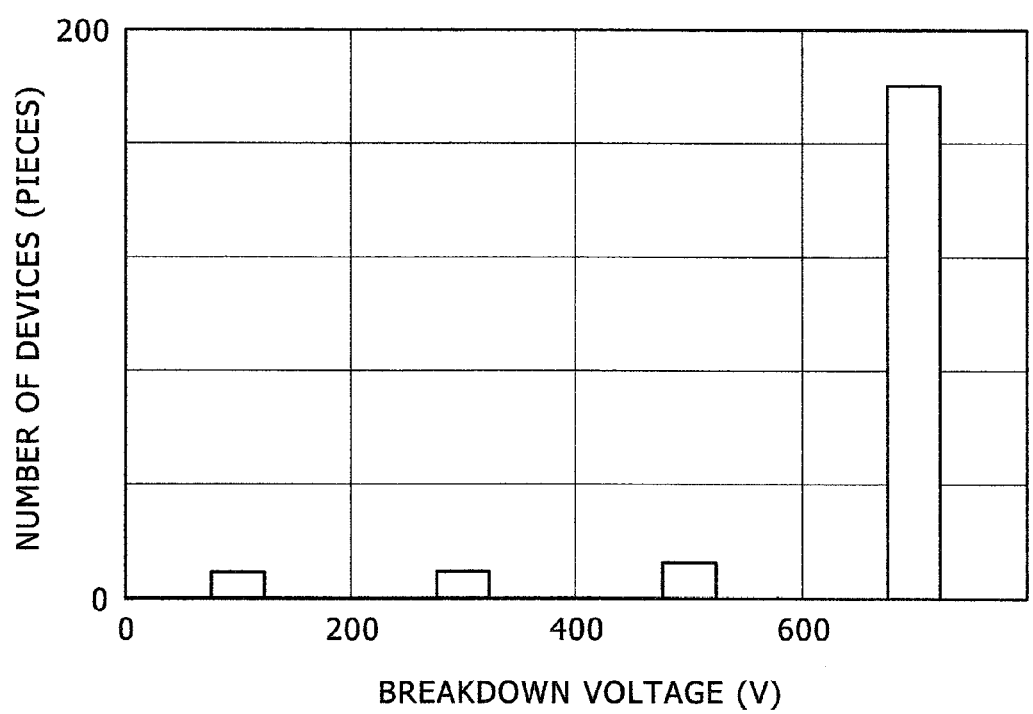
FIG. 5A is a diagram showing breakdown distribution of a p-n junction diode according to a manufacturing method of the present invention.
Figure 5B:
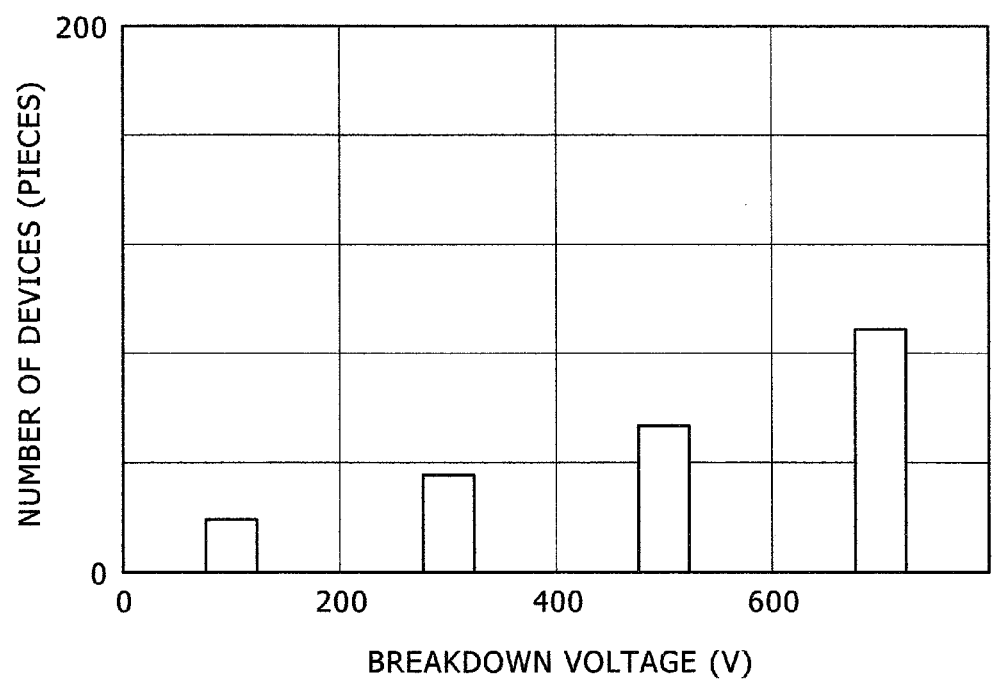
FIG. 5B is a diagram showing breakdown distribution of a p-n junction diode according to a conventional manufacturing method.

The initial characteristics of 200 p-n junction diodes per one monocrystalline silicon carbide substrate that were produced on each of two monocrystalline silicon carbide substrates were evaluated. The distributions of breakdown voltage of the p-n junction diode according to the manufacturing method of the present invention and the p-n junction diode according to the conventional manufacturing method are shown in FIGS. 5A and 5B, respectively. When the diode with a breakdown voltage of 600V or more (defined as current<0.1 mA) was assumed as non-defective, the yield rate of the p-n junction diode according to the manufacturing method of the present invention was 87% (FIG. 5A) and that of the p-n junction diode according to the conventional manufacturing method was 47% (FIG. 5B). It is conceivable that the improved yield rate was achieved mainly by the effect that the density of the epitaxy defects in the drift layer of the p-n junction diode according to the manufacturing method of the present invention was reduced to about 60% of that of the p-n junction diode according to the conventional manufacturing method.

Next, a current of 50 A/cm$^2$ was applied to the p-n junction diodes, and maintained for 10 hours to examine increase of on-voltage. In the p-n junction diodes according to the conventional manufacturing method, the increase of on-voltage by about 1V was observed at 8 diodes among observed 25 ones. On the contrary, in the p-n junction diodes according to the manufacturing method of the present invention, the increase of on-voltage was prevented to 0.1V or less at all of the observed 25 ones. It is conceivable that the difference was reflected by the effect of the metal contamination removal process conducted at the end of manufacturing the monocrystalline silicon carbide substrate. Such a mechanism of initial fluctuation at the time of applying current is still being studied, and all factors have not been found out yet. It is generally conceivable that the basal-plane dislocation is involved in the fluctuation of on-voltage of the p-n junction diodes. It is conceivable that the fact that the epitaxial growth layer according to the manufacturing method of the present invention is smaller in basal-plane dislocation density than that according to the conventional manufacturing method was led to the difference. Further, it is said that not the all basal-plane dislocation but a part of basal-plane dislocation acts on the characteristic fluctuation at the time of applying current. There is also a hypothesis that some metal impurity is modified in the basal-plane dislocation acting on the fluctuation. If the theory is correct, there is a possibility that the metal contamination to be drawn in the epitaxial layer was reduced not by the difference of the basal-plane dislocation density, but by largely reducing the metal contamination remaining on the surfaces of the substrate after polishing the surfaces of the substrate in the manufacturing method of the present invention, and as a result, the basal-plane dislocation density acting on the fluctuation at the time of applying current was reduced.

There is a possibility that the decrease in the density of basal-plane dislocation in which metal impurities were captured contributed to the decrease in the number of defectives in breakdown voltage, and to the improvement of the yield rate.

By applying the manufacturing method of the present invention, the yield rate of the p-n junction diode was improved and the characteristic fluctuation at the time of applying current was largely prevented, as compared to the case where the conventional manufacturing method was applied. In the first embodiment, the oxygen plasma process using the dry etching system was performed to form the films primarily including silicon dioxide. However, the oxygen plasma process can be performed by using another system, such as an asher system. The dry etching system was used in the first embodiment because the reaction chamber could be cleaned. In the system of the first embodiment, after completing the oxygen plasma process of the first embodiment, the reaction chamber was cleaned by plasma of a mixture gas of chlorine and oxygen. When the metal contamination was examined by performing an argon plasma process for the cleaned silicon substrate, its cleanliness was the same as that before the process, and there was no effect of system contamination caused by the use in the process. In the case of using a system without a cleaning mechanism, it is difficult to maintain the cleanliness of the system. As an oxidation method, oxidation such as anode oxidation, thermal oxidation, and oxidation using ozone can be used. However, in the case of the thermal oxidation, the temperature becomes as high as about 1000° C., and thus, it is disadvantageously more difficult to maintain the cleanliness of the system. In the case of the oxidation using ozone, the temperature can be lowered as compared to normal thermal oxidation using oxygen. Ozone has an effect of inducing oxidation of the surface of the monocrystalline silicon carbide substrate by being used with ultraviolet irradiation and the oxygen plasma process, in addition to the use for thermal oxidation.

Further, it is preferable that each film primarily including silicon dioxide formed on the surfaces is less than 5 nm. If each film is oxidized to have a thickness of 5 nm or more, irregularities are slightly generated on the surfaces of the monocrystalline silicon carbide substrate at the time of the subsequent process of removing the oxidized films using a hydrofluoric acid aqueous solution. It has been found that the irregularities generated on the surfaces of the substrate cause the increase of inverse leak current of the p-n junction diode. The oxidation of a thickness of less than 5 nm could be easily realized by selecting the RF bias power or the like in the oxygen plasma process. Even in the case of using another oxidation method, if the processing conditions are appropriately selected, the oxidation of a film thickness of less than 5 nm is possible as similar to the first embodiment.

Second Embodiment

A second embodiment will be described using FIGS. 6 to 10. The second embodiment is an embodiment applied to manufacturing of a p-n junction diode. A 4H—SiC, 4° off monocrystalline silicon carbide substrate used in the second embodiment was purchased from a manufacturer of a substrate with designated specification. The front surface of the crystal substrate is a silicon plane ((0001) plane), and the back surface thereof is a carbon plane ((000-1) plane). The front surface has a (0001) plane with 4° off-angle inclined toward [11-20]. The epitaxial growth of the drift layer on the substrate was also carried out by the manufacturer of a substrate. After inspection of the delivered substrate, it was found that the diameter was 76.2 mm at the most, and primary and secondary orientation flats were formed. The thickness thereof was 350 µm.

The concentration of nitrogen of the epitaxial layer was $2 \times 10^{16}$ cm$^{-3}$ and the thickness thereof was 8 µm, which were as designated specification. FIG. 6 shows a result of analyzing the metal contamination on the surface of the delivered substrate. A measurement method, measurement spots, and a displaying format of the result are the same as those of FIG. 2C in the first embodiment. All the elements of titanium, chromium, iron, nickel, copper, and zinc remained on the surface of the substrate. It is unclear at which stage these metal elements were attached to the surface of the substrate. The contamination caused by tools used in the slice process and the lapping process, and the slurry used in the polishing process for manufacturing the monocrystalline silicon carbide substrate are suspicious. Further, there is a possibility that the contamination was drawn in during the epitaxial growth. It is conceivable that since the metal contamination removal process of the present invention as described in the first embodiment was not performed after the polishing process of the substrate, the metal elements remaining on the surface of the substrate were drawn in the epitaxial layer. Alternatively, there is a high possibility that in the epitaxial growth system, the substrate on the surface of which the metal elements remained was repeatedly heated, so that the epitaxial growth system itself was also contaminated by the metal elements. Accordingly, it is conceivable that the metal elements were possibly drawn in from the epitaxial growth system during the epitaxial growth. Further, there is also a possibility that the metal elements were contained in parts of the epitaxial growth system, the temperature of the members became high at the time of heating for the epitaxial growth, and the metal elements out-diffused therefrom to be drawn in the substrate.

In the first place, two substrates were dipped into aqua regia for 180 seconds, and were, after water rinse, dipped into a sulfuric acid-hydrogen peroxide solution mixture kept at 120° C. for 180 seconds. The mixture ratio of sulfuric acid and hydrogen peroxide solution (31% aqueous solution) was 7:3. After water rinse, the substrates were dipped into a hydrofluoric acid aqueous solution for 180 seconds. The mixture ratio of hydrofluoric acid (55% aqueous solution) and water was 1:20. By dipping into the a hydrofluoric acid aqueous solution, the films primarily including silicon dioxide formed on the frond and back surfaces of the monocrystalline silicon carbide substrates were removed by the oxygen plasma process. Finally, the substrates were dipped into an ammonia-hydrogen peroxide solution mixture for 120 seconds, rinsed by water, and dried by a spin drier. This series of cleaning processes is not necessarily essential in terms of removal of metal contamination. However, it was conducted with the aim of preventing the contamination of the micro-wave plasma etching system for performing the oxygen plasma process as much as possible. FIG. 7 shows a result obtained by analyzing the metal contamination on the surface of one of two substrates again after a series of cleaning processes. Although the contamination by titanium, chrome, nickel, and copper was removed by the cleaning, but iron and zinc still remained after the cleaning.

Next, the oxygen plasma process was performed for one of two substrates. The oxygen plasma process was performed using a micro-wave plasma etching system. The process was performed under the conditions of an oxygen flow rate of 200 sccm, a pressure of 5 Pa in a reaction chamber, a micro-wave source power of 800 W, and an RF bias power of 7 W, and the duration was 60 seconds for each of the front and back surfaces. Each electrode of the system was shaped in a circular form with a diameter of about 200 mm. Thus, the RF bias power per unit area was 0.022 W/cm$^2$. In the first place, the front surface of the monocrystalline silicon carbide substrate was processed while the front surface was directed upward. Next, the back surface of the monocrystalline silicon carbide substrate was processed while the back surface was directed upward. Films primarily including silicon dioxide were formed on the front and back surfaces of the monocrystalline silicon carbide substrate by the oxygen plasma process. The thickness of each film primarily including silicon dioxide formed on the surfaces made of silicon was less than 3 nm. In this stage, a result obtained by analyzing the metal contamination on the surface of the substrate again is shown in FIG. 8. The metal contamination was not reduced only by the oxygen plasma process, and iron and zinc remained. In the manufacturing method of the present invention, the RF bias power was set to a sufficiently low level, so that the damages were not introduced to the monocrystalline silicon carbide substrate. Therefore, it is conceivable that a mechanism by which the metal contamination was physically removed by ion collision was hardly present. The reaction chamber of the etching system used for the process was cleaned by using a mixture gas of chlorine and oxygen, and then, the metal contamination was examined using the silicon substrate. The result showed that its cleanliness was the same as that before the process, and there was no effect of system contamination caused by the use in the process.

After a certain period of time, the wet-chemical cleaning in each of aqua regia, a sulfuric acid-hydrogen peroxide solution mixture, a hydrofluoric acid aqueous solution, and an ammonia-hydrogen peroxide solution mixture was performed again for the substrates. The components of the chemical liquid used and the cleaning conditions were the same as those in the cleaning of the monocrystalline silicon carbide substrate according to the second embodiment of the present invention. This series of wet-chemical cleaning was performed for a substrate for which the oxygen plasma process was not performed, and the surfaces were analyzed again.

FIG. 9 shows a result obtained by analyzing the metal contamination of the surface of the monocrystalline silicon carbide substrate of the second embodiment. FIG. 10 shows a result obtained by analyzing the metal contamination of the surface of the monocrystalline silicon carbide substrate according to the conventional manufacturing method in which the oxygen plasma process was not used. The elements of iron and zinc remained on the surface of the substrate according to the conventional manufacturing method. However, there existed all the elements including iron and zinc on the surface of the substrate according to the present invention only in the number of the detection limit or less. It is conceivable that the difference of the remaining metal contamination depended on whether or not the surface of the monocrystalline silicon carbide substrate was oxidized. Specifically, in the case of the manufacturing method of the present invention, by exposing the substrates to oxygen plasma, the thin films primarily including silicon dioxide were formed on the surfaces of substrates. The metal elements existing on the surfaces of the substrates emerge on the oxidized films or are drawn into the oxidized films in many cases. When the oxidized films are removed in a hydrofluoric acid aqueous solution, the metal elements on or in the oxidized films are simultaneously removed. When the conventional manufacturing method used in manufacturing a silicon semiconductor device is applied, as it is, to the manufacturing of the monocrystalline silicon carbide substrate, even if the monocrystalline silicon carbide substrate is dipped into a chemical liquid containing hydrogen peroxide, the films primarily including silicon dioxide are barely formed, unlike the case of a monocrystalline silicon substrate. Therefore, it is conceivable that such a mechanism for removing the metal contamination is not realized.

P-n junction diodes similar to those in the first embodiment were produced by using each one of the substrates in which the metal contamination was removed in accordance with the manufacturing method of the present invention and the conventional manufacturing method, and the initial characteristics of the p-n junction diodes were evaluated. The number of evaluated p-n junction diodes was 200 per one substrate. When the diode with a breakdown voltage of 600V or more (defined as current<0.1 mA) was assumed as non-defective, the yield rate of the p-n junction diode according to the manufacturing method of the present invention was 75%, and that of the p-n junction diode according to the conventional manufacturing method was 45%. A large difference is not supposedly present in density of epitaxy defects of the drift layer between the p-n junction diode according to the manufacturing method of the present invention and the p-n junction diode according to the conventional manufacturing method. A large difference is not supposedly present, either, in basal-plane dislocation density of the drift layer. As described in the first embodiment, there is a theory that the basal-plane dislocation in which some metal impurity is modified causes the reduction of breakdown voltage.

There is a possibility that the reduction of the metal contamination on the surface of the drift layer decreased the metal elements drawn in the drift layer during the activation annealing process in the manufacturing of the p-n junction diode, and as a result, the decrease in basal-plane dislocation density of the drift layer in which metal impurities were captured contributed to the decrease in the number of defectives in breakdown voltage, and to the improvement of the yield rate. However, the detail of the mechanism is not clear.

Next, a current of 50 A/cm$^2$ was applied to the p-n junction diodes, and maintained for 10 hours to examine increase of on-voltage. In the result of measuring 25 p-n junction diodes produced by the conventional manufacturing method, the increase of on-voltage by about 1V was observed at 13 diodes. On the contrary, in the p-n junction diodes according to the manufacturing method of the present invention, the increase of on-voltage was prevented to 0.2V or less at all of the observed 25 diodes. As similar to the breakdown, it is conceivable that the difference was caused by the decrease of the basal-plane dislocation density of the drift layer in which the metal impurities were captured in the p-n junction diode according to the manufacturing method of the present invention. However, the detail of the mechanism is not clear.

It should be noted that in place of the (0001) plane used in the second embodiment, a substrate with a (000-1) plane or a (11-20) plane may be used. Further, the off-angle is not limited to 4°, but may be in the range of about 0 to 8°. Furthermore, the diameter and thickness of the substrate may be other dimensions. Even if these substrates are used, the same effect as the present invention can be obtained.

Third Embodiment

Figure 11A:
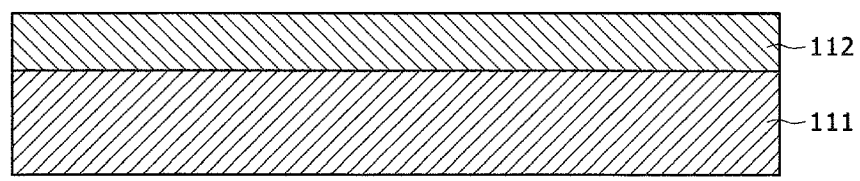
FIG. 11A is a cross sectional view showing a manufacturing process of a JBS diode of a third embodiment.
Figure 11B:
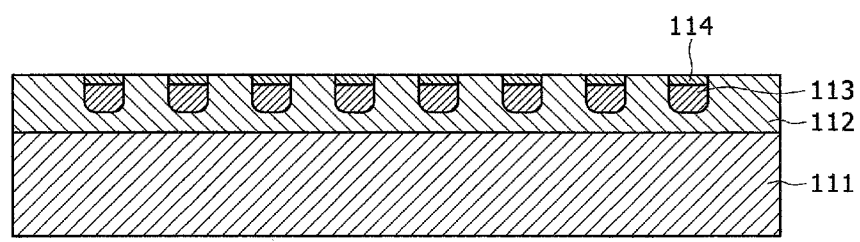
FIG. 11B is a cross sectional view showing a manufacturing process of the JBS diode of the third embodiment.
Figure 11C:
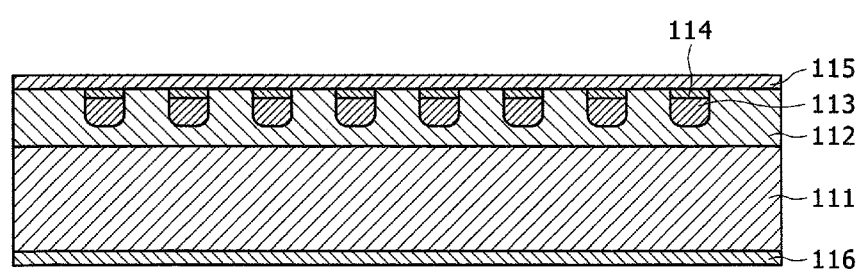
FIG. 11C is a cross sectional view showing a manufacturing process of the JBS diode of the third embodiment.

A third embodiment will be described using FIGS. 11A to 11G. The third embodiment is an embodiment in which the present invention was applied to manufacturing of a JBS diode formed by combining a Schottky barrier and a p-n junction. FIGS. 11A to 11C are cross sectional views each showing a manufacturing process of the JBS diode of the third embodiment. A termination area for relaxing the electric field was formed around the JBS diode, but the illustration thereof was omitted in FIGS. 11A to 11F. As shown in FIG. 11C, the JBS diode of the third embodiment includes an n-type drift layer 112 containing nitrogen which is provided on a front surface of a monocrystalline silicon carbide substrate 111 and has a thickness of about 20 µm, a p-type doped layer 113 containing Al which is provided on a part of a surface of the drift layer 112 and has a thickness of 1 µm, and a high-concentration p-type layer 114 containing Al which is provided on the upper side of the p-type doped layer 113 and has a thickness of 0.1 µm. The donor concentrations of the monocrystalline silicon carbide substrate 111 and the n-type drift layer 112 were 3×10$^{18}$ cm$^{-3}$ and 2×10$^{15}$ cm$^{-3}$, respectively, and the acceptor concentrations of the p-type doped layer 113 and the high-concentration p-type layer 114 were 2×10$^{18}$ cm$^{-3}$ and 5×10$^{19}$ cm$^{-3}$.

The manufacturing method of the JBS diode of the third embodiment will be described. In the first place, the monocrystalline silicon carbide substrate 111 as shown in FIG. 11A was prepared. The monocrystalline silicon carbide substrate 111 was a 4H—SiC, 4° off monocrystalline silicon carbide substrate with 4° off-angle inclined toward [11-20]. The diameter thereof was 76.2 m at the most, and the thickness thereof was 350 µm. The front surface was a (0001) plane. The drift layer 112 was formed on the surface of the monocrystalline silicon carbide substrate 111.

Next, in the process of FIG. 11B, ion implantation of Al was performed on a part of the surface of the drift layer 112 to form the p-type doped layer 113. Next, ion implantation of Al was performed on the surface of the p-type doped layer 113 with a higher dose to form the high-concentration p-type layer 114. After forming the p-type doped layer 113 and the high-concentration p-type layer 114, the metal contamination removal process of the present invention was applied. The object of applying the metal contamination removal process was to clean the monocrystalline silicon carbide substrate 111 before a high-temperature heating process for impurity activation.

In the first place, an oxygen plasma process was performed on the front and back surfaces of the monocrystalline silicon carbide substrate 111. The oxygen plasma process was performed using an asher system. The process was performed under the conditions of an oxygen flow rate of 100 sccm, a pressure of 10 Pa in a reaction chamber, and an RF power of 5 W, and the duration was 30 seconds for each of the front and back surfaces. The RF power per unit area was 0.1 W/cm$^2$. The RF power was set to a sufficiently low level, so that the damages were not introduced to the monocrystalline silicon carbide substrate. The front surface of the monocrystalline silicon carbide substrate was processed while the front surface was directed upward. Next, the back surface of the monocrystalline silicon carbide substrate 111 was processed while the back surface was directed upward. Films primarily including silicon dioxide were formed on the front and back surfaces of the monocrystalline silicon carbide substrate 111 by the oxygen plasma process. The thickness of each film primarily including silicon dioxide formed on the surfaces made of silicon was less than 2 nm.

Figure 11D:
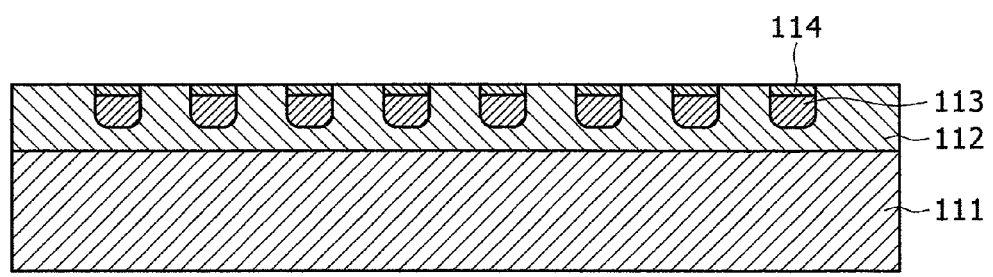
FIG. 11D is a cross sectional view showing a manufacturing process of the JBS diode of the third embodiment.

After a certain period of time, the wet-chemical cleaning in each of aqua regia, a sulfuric acid-hydrogen peroxide solution mixture, a hydrofluoric acid aqueous solution, and an ammonia-hydrogen peroxide solution mixture was performed for the substrate. The components of the chemical liquid used and the cleaning conditions were the same as those in the cleaning of the monocrystalline silicon carbide substrate according to the first embodiment of the present invention. Next, in order to prevent the front and back surfaces of the monocrystalline silicon carbide substrate 111 from being altered, carbon films 115 and 116, each having a thickness of 100 nm, were formed on the front and back surfaces of the monocrystalline silicon carbide substrate 111, respectively, as shown in FIG. 11C. A sputtering method was used to form the carbon films. However, the films may be formed by other film formation methods such as a plasma CVD method using methane. The carbon film 116 was formed even on the back surface of the substrate due to the effect of decreasing contact resistance of the back surface and the effectiveness in strengthening adhesion force with respect to the substrate 111 of a back-surface electrode. In this state, activation annealing was thereafter performed at 1800° C. in vacuum. The duration for keeping at 1800° C. was one minute. Thereafter, the carbon films were removed by dry etching using oxygen, resulting in the state as shown in FIG. 11D. The etching was performed under the conditions of an oxygen flow rate of 100 sccm, a pressure of 10 Pa in a reaction chamber, and an RF power of 50 W, and the duration was 90 seconds for each of the front and back surfaces. The RF power per unit area was 0.1 W/cm$^2$. The RF power was set to a sufficiently low level, so that the damages were not introduced to the monocrystalline silicon carbide substrate. After the carbon films were removed, the surfaces of the monocrystalline silicon carbide substrate 111 were exposed to oxygen plasma. The thickness of each film primarily including silicon dioxide formed on the surfaces made of silicon was less than 2 nm. After a certain period of time, the wet-chemical cleaning in each of a hydrofluoric acid aqueous solution and an ammonia-hydrogen peroxide solution mixture was performed for the substrate. The components of the chemical liquid used and the cleaning conditions were the same as those in the cleaning of the monocrystalline silicon carbide substrate according to the first embodiment of the present invention.

Figure 11E:
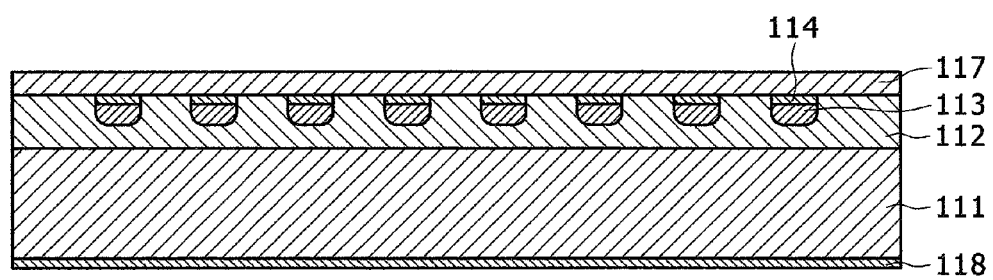
FIG. 11E is a cross sectional view showing a manufacturing process of the JBS diode of the third embodiment.
Figure 11F:
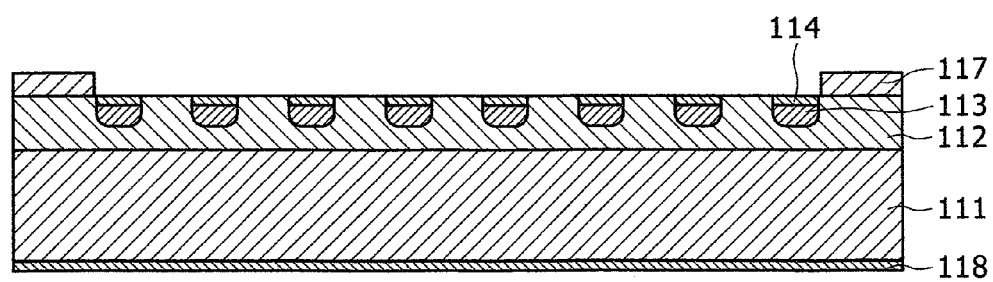
FIG. 11F is a cross sectional view showing a manufacturing process of the JBS diode of the third embodiment.
Figure 11G:
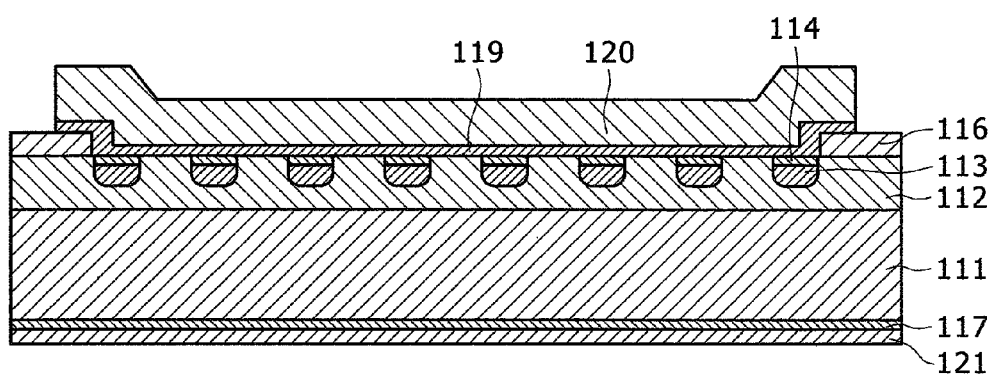
FIG. 11G is a cross sectional view showing a manufacturing process of the JBS diode of the third embodiment.

Next, as shown in FIG. 11E, a silicon dioxide film 117 was formed, and further, a back-surface nickel film was formed by a plasma CVD method. Then, a heating process was performed using an RTA system at 1000° C. for one minute in an argon atmosphere. A layer 118 primarily including nickel silicide was formed on the back surface. Next, an opening was formed on the silicon dioxide film 117, resulting in the state as shown in FIG. 11F. The silicon dioxide film 117 was etched by a wet etching technique. Next, as shown in FIG. 11G, an electrode composed of laminated films of a nickel film 119 having a thickness of 50 nm and an aluminum film 119 having a thickness of 3 μm was formed on the front surface. The nickel film and the aluminum film were formed by a sputtering system, and were patterned by a well-known lithography process and a wet etching technique. A nickel film 121, serving as a back-surface electrode, with a thickness of 100 nm was formed on the back surface by the sputtering system. Finally, a passivation film made of polyimide resin was formed, but is not shown in FIG. 9F. As described above, the JBS diode of the third embodiment was produced by the manufacturing method of the present invention.

The initial characteristics of the JBS diodes according to the manufacturing method of the present invention were evaluated. The number of evaluated JBS diodes was 100. When the diode with a breakdown voltage of 3.5V or more (defined as current<0.1 mA) was assumed as non-defective, the yield rate was 63%. The yield rate of the diode according to the conventional manufacturing method was 45%, and thus, the yield was considerably improved. When the reverse leak current of the diode was measured at 2 kV, the average value of the 100 diodes was decreased to about 40% of that according to the conventional manufacturing method. It is conceivable that the leak current mainly flows in the Schottky barrier diode. In the manufacturing method of the present invention, by removing the metal contamination of the surface of the monocrystalline silicon carbide substrate before and after the activation heating process, a clean interface between the electrode and the monocrystalline silicon carbide substrate was realized as compared to the case of the conventional manufacturing method, which possibly contributed to the decrease of the leak current.

Next, a current of 70 A/cm$^2$ was applied to the JBS diodes, and maintained for 10 hours to examine increase of on-voltage. In the result of measuring 25 JBS diodes produced by the conventional manufacturing method, the increase of on-voltage by about 1V was observed at 14 diodes. On the contrary, in the JBS diodes according to the manufacturing method of the present invention, the increase of on-voltage was prevented to 0.3V or less at all of the observed 25 diodes. Although its mechanism is unclear, the yield rate of the JBS diode was improved, the inverse leak current was decreased, and the characteristic fluctuation at the time of applying current was largely prevented, as compared to the case in which the conventional manufacturing method was used. It should be noted that in place of the (0001) plane used in the third embodiment, a substrate with a (000-1) plane or a (11-20) plane may be used. Further, the off-angle is not limited to 4°, but may be in the range of about 0 to 8°. Furthermore, the diameter and thickness of the substrate may be other dimensions. Even if these substrates are used, the same effect as the present invention can be obtained.

Fourth Embodiment

Figure 12A:
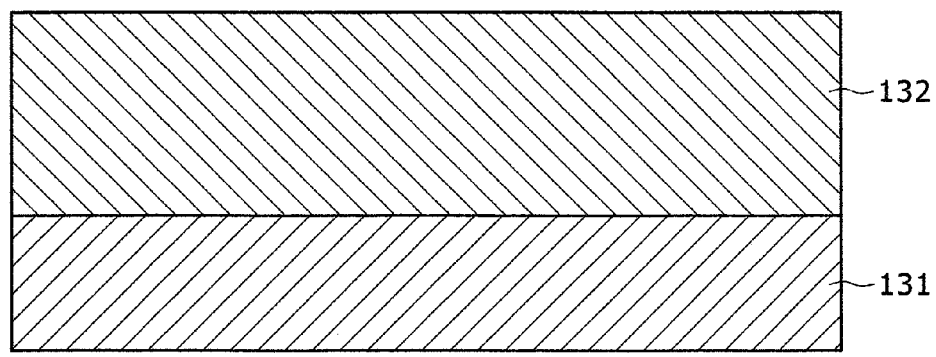
FIG. 12A is a cross sectional view showing a manufacturing process of an MOSFET of a fourth embodiment.
Figure 12B:
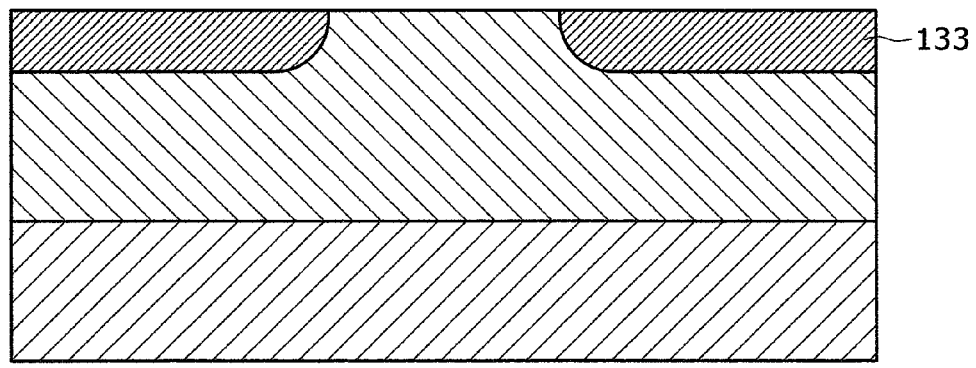
FIG. 12B is a cross sectional view showing a manufacturing process of the MOSFET of the fourth embodiment.

A fourth embodiment will be described using FIG. 12A to 12H, and FIGS. 13A to 13G. The fourth embodiment is an embodiment in which the present invention was applied to manufacturing of an n-channel planar MOSFET (Metal Oxide Semiconductor Field Effect Transistor). Each of FIG. 12A to 12H, and FIGS. 13A to 13G is a cross sectional view showing a manufacturing process of the MOSFET of the fourth embodiment. A monocrystalline silicon carbide substrate 131 as shown in FIG. 12B was prepared. In order to confirm the effect of the present invention, two substrates 131 were used. The monocrystalline silicon carbide substrate 131 was a 4H—SiC 4° off monocrystalline silicon carbide substrate with 4° off-angle inclined toward [11-20]. The diameter thereof was 100 mm at the most, and the thickness thereof was 380 μm. The front surface was a (0001) plane. A drift layer 132 having a thickness of 10 μm was formed on the substrate 131. The substrate 131 was an n$^+$ substrate, and the drift layer 132 was an n$^-$ layer. In the process of FIG. 12B, ion implantation of boron was performed on a part of a surface of the drift layer 132 to form a p-type base layer 133. The ion implantation was performed using silicon dioxide as a mask in a state where the substrate temperature was maintained at 500° C. The dose amount was $1.5 \times 10^{16}$ cm$^{-2}$, and the concentration was about $5 \times 10^{17}$ cm$^{-3}$. As dopant, it is possible to use aluminum instead of boron. After the ion implantation, the substrates were dipped into a hydrofluoric acid aqueous solution to remove silicon dioxide as a mask. The metal contamination removal process of the present invention was applied to one of two substrates 131, and an oxygen plasma process was performed in the first place. The oxygen plasma process was performed by using a micro-wave plasma etching system, as similar to the second embodiment. The process was performed under the conditions of an oxygen flow rate of 200 sccm, a pressure of 5 Pa in a reaction chamber, a micro-wave source power of 800 W, and an RF bias power of 7 W, and the duration was 60 seconds. Each electrode of the system was shaped in a circular form with a diameter of about 200 mm.

Thus, the RF bias power per unit area was 0.022 W/cm$^2$. Films primarily including silicon dioxide were formed on the surfaces of the monocrystalline silicon carbide substrate 131 by the oxygen plasma process. The thickness of each film primarily including silicon dioxide on the surfaces made of silicon was less than 3 nm. The dry etching system used for the oxygen plasma process for the monocrystalline silicon carbide substrate was cleaned by using a mixture gas of chlorine and oxygen after the process. This cleaning was a procedure taken to prevent the contamination of the inside of the dry etching system caused by the process for the monocrystalline silicon carbide substrate 131 from being adhered to another substrate to be processed later. After a certain period of time, the wet-chemical cleaning in each of aqua regia, a sulfuric acid-hydrogen peroxide solution mixture, a hydrofluoric acid aqueous solution, and an ammonia-hydrogen peroxide solution mixture was performed again for the substrate. The components of the chemical liquid used and the cleaning conditions were the same as those in the cleaning of the monocrystalline silicon carbide substrate according to the second embodiment of the present invention. This series of wet-chemical cleaning was performed for the other substrate 131 for which the oxygen plasma process was not performed. Next, an activation heating process was performed for the cleaned substrate 131. The process was performed at 1850° C. for three minutes under a reduced pressure of about 1 Pa while flowing Ar at 100 sccm. At the time of the heating process, a carbon film having a thickness of 100 nm was used as a passivation film, as similar to the third embodiment. Unlike the third embodiment, the passivation film was formed only on the front surface side of the substrate 131, and was removed using the same method and under the same conditions as the third embodiment after the heating process.

Figure 12C:
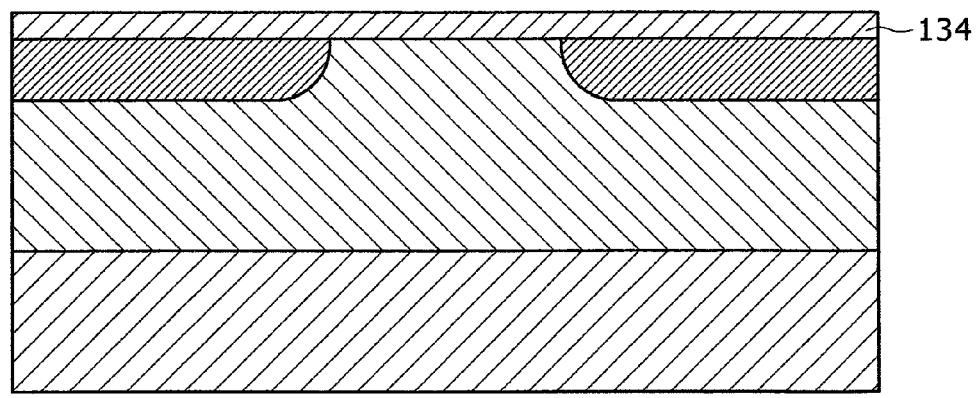
FIG. 12C is a cross sectional view showing a manufacturing process of the MOSFET of the fourth embodiment.
Figure 12D:
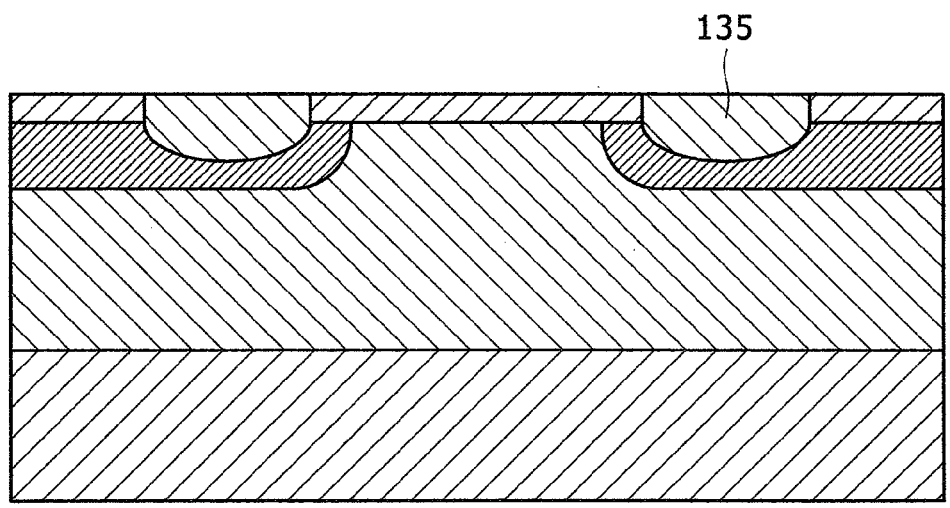
FIG. 12D is a cross sectional view showing a manufacturing process of the MOSFET of the fourth embodiment.
Figure 12E:
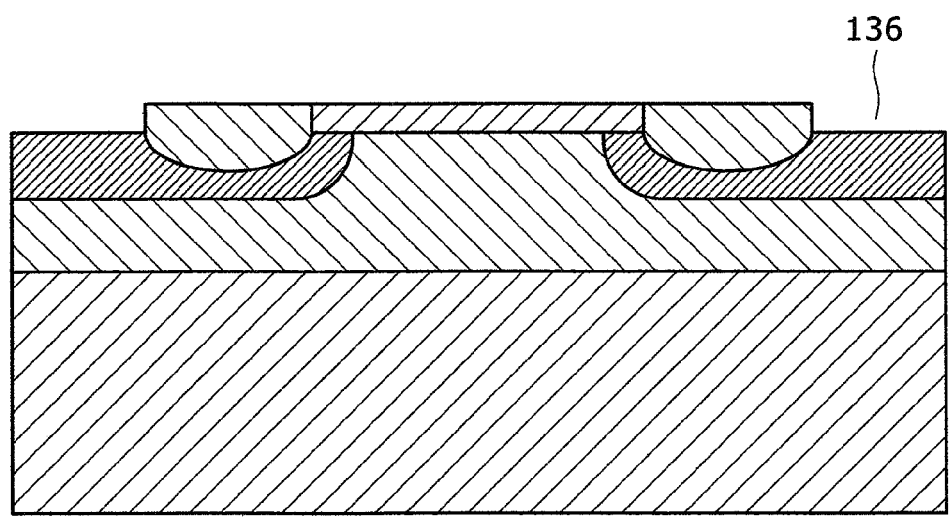
FIG. 12E is a cross sectional view showing a manufacturing process of the MOSFET of the fourth embodiment.
Figure 12F:
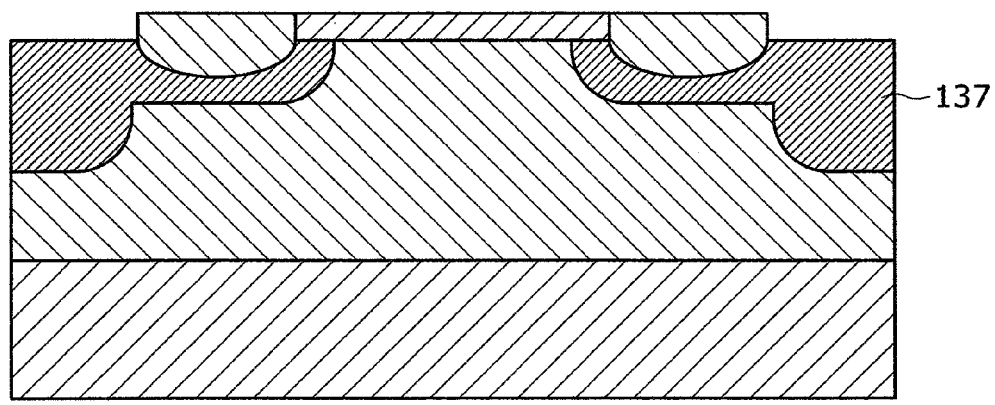
FIG. 12F is a cross sectional view showing a manufacturing process of the MOSFET of the fourth embodiment.

Next, as shown in FIG. 12C, an n⁻ epitaxial layer 134 was formed on each surface of two substrates 131 by epitaxial growth. An MOSFET channel layer was formed in the n⁻ epitaxial layer 134. The conditions of the epitaxial growth were common in two substrates 131. The epitaxial growth layer contained nitrogen as dopant, and its concentration was $1\times10^{16}$ cm$^{-3}$. After the epitaxial growth, an n⁺ source layer 135 was formed on a certain area by ion implantation of nitrogen as shown in FIG. 12D. This ion implantation was performed while maintaining the substrate temperature at 500° C., and the dose amount was $1\times10^{15}$ cm$^{2}$. Next, as shown in FIG. 12E, a part 136 of the epitaxial layer 134 was removed by a reactive ion etching. At this time, a silicon dioxide film was used as a mask of etching. After a certain period of time, a deep base layer 137 was formed by the ion implantation again, resulting in the state as shown in FIG. 12F. The etching mask was removed in a hydrofluoric acid aqueous solution, and then, the metal contamination removal process of the present invention was applied to one of the two substrates 131 again. The substrate to which the process was applied was the same as that to which the metal contamination removal process of the present invention was applied before the epitaxial growth. The system used for the oxygen plasma process and the conditions of the process were the same as those before the epitaxial growth. The cleaning of the system after the plasma process was the same as that before the epitaxial growth. A series of wet-chemical cleaning performed after the oxygen plasma process was performed for not only one substrate 131 for which the oxygen plasma process was performed, but also the other substrate 131 for which the oxygen plasma process was not performed.

Figure 12G:
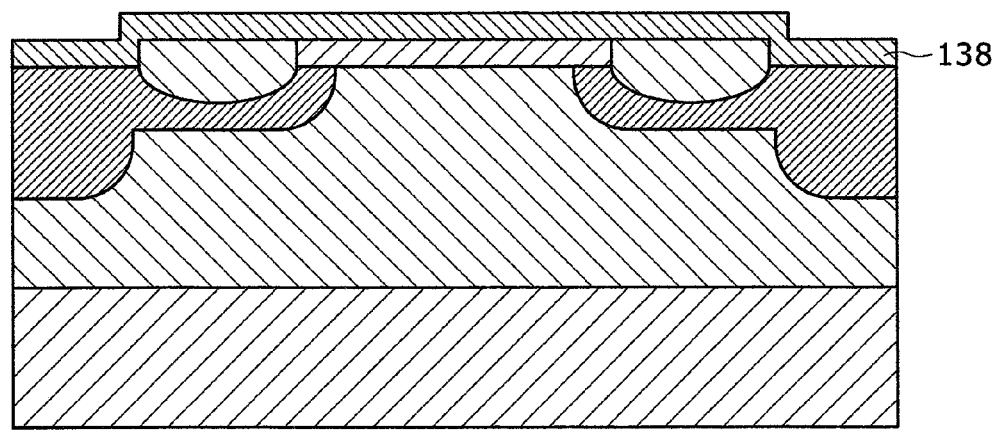
FIG. 12G is a cross sectional view showing a manufacturing process of the MOSFET of the fourth embodiment.
Figure 12H:
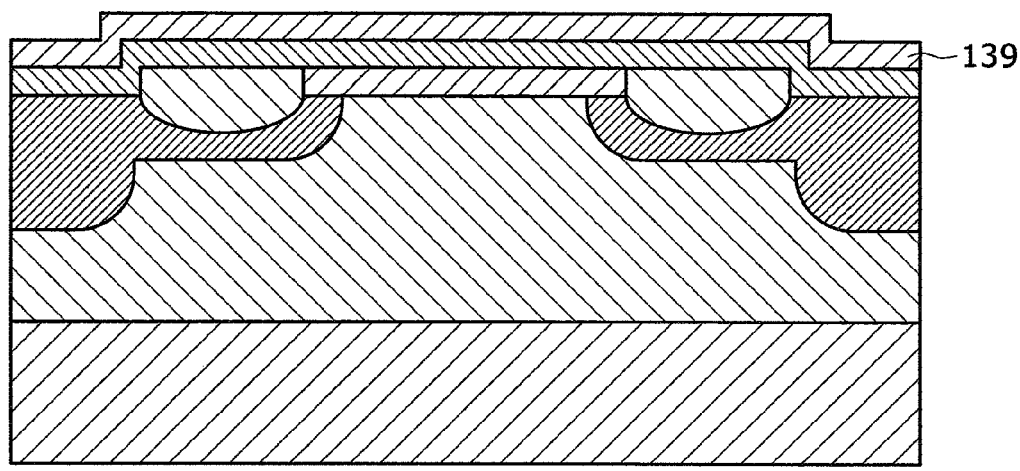
FIG. 12H is a cross sectional view showing a manufacturing process of the MOSFET of the fourth embodiment.
Figure 13A:
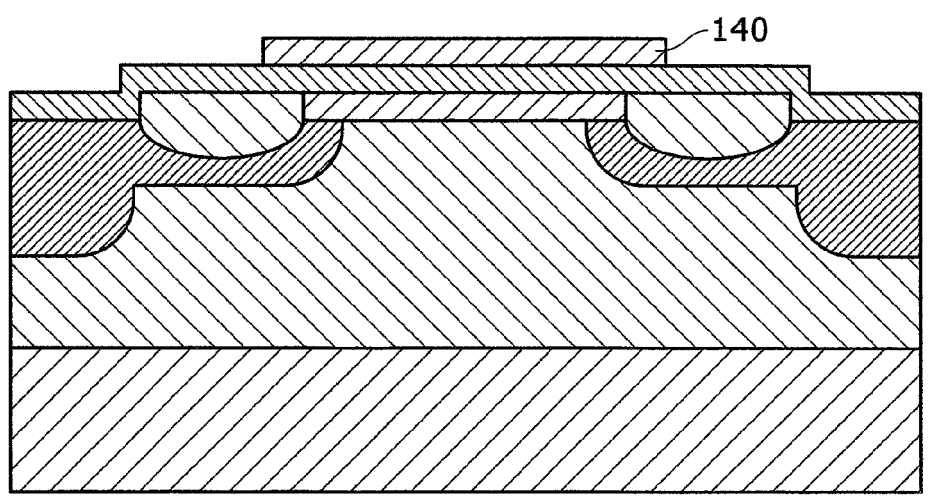
FIG. 13A is a cross sectional view showing a manufacturing process of the MOSFET of the fourth embodiment.
Figure 13B:
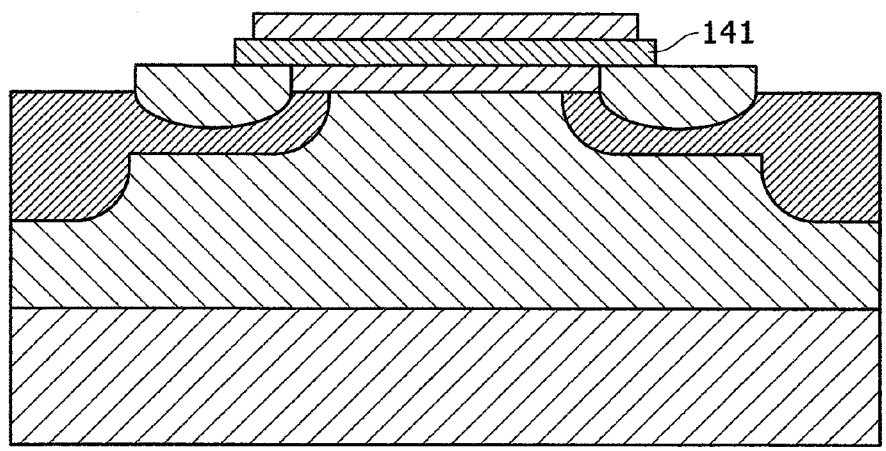
FIG. 13B is a cross sectional view showing a manufacturing process of the MOSFET of the fourth embodiment.
Figure 13C:
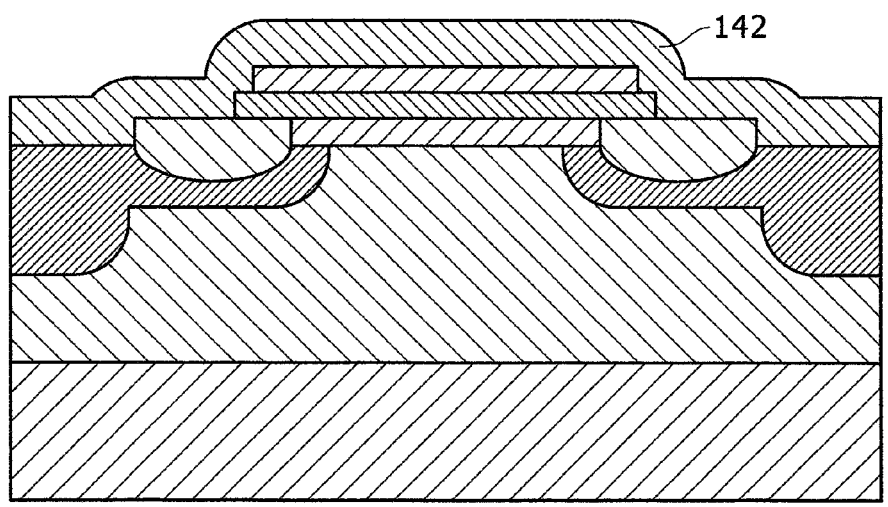
FIG. 13C is a cross sectional view showing a manufacturing process of the MOSFET of the fourth embodiment.
Figure 13D:
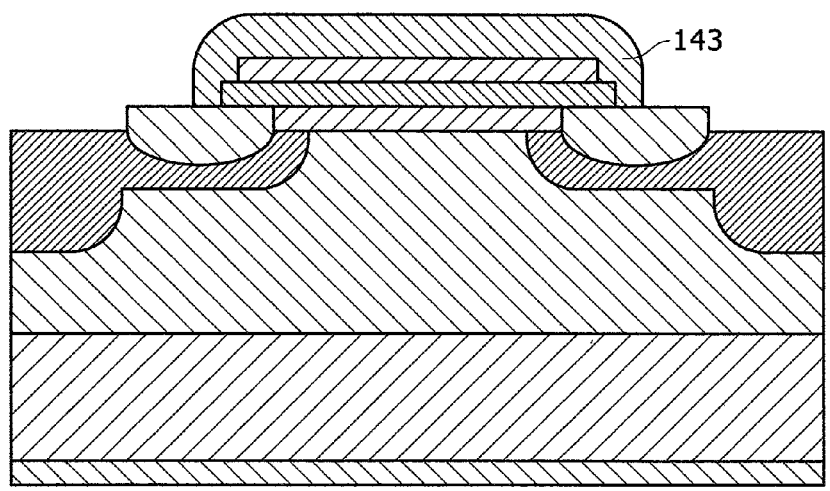
FIG. 13D is a cross sectional view showing a manufacturing process of the MOSFET of the fourth embodiment.
Figure 13E:
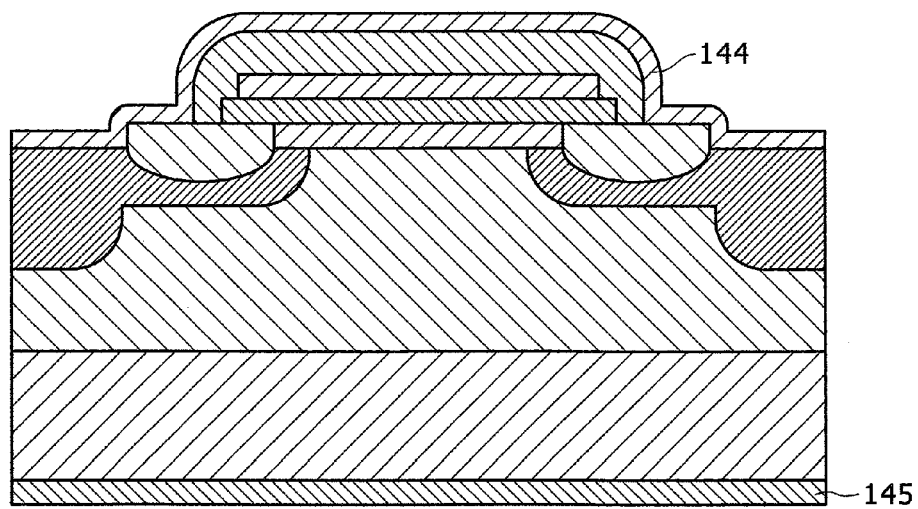
FIG. 13E is a cross sectional view showing a manufacturing process of the MOSFET of the fourth embodiment.
Figure 13F:
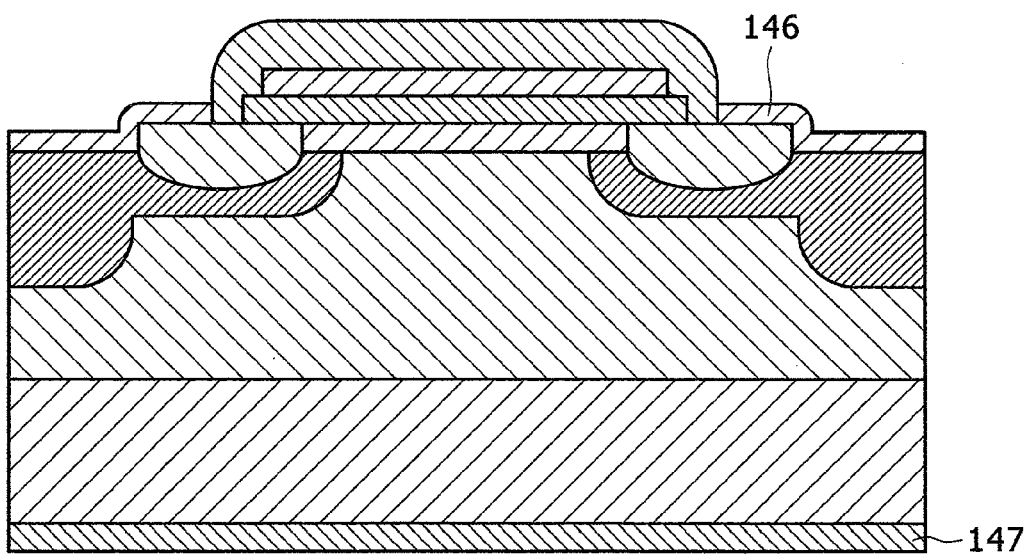
FIG. 13F is a cross sectional view showing a manufacturing process of the MOSFET of the fourth embodiment.
Figure 13G:
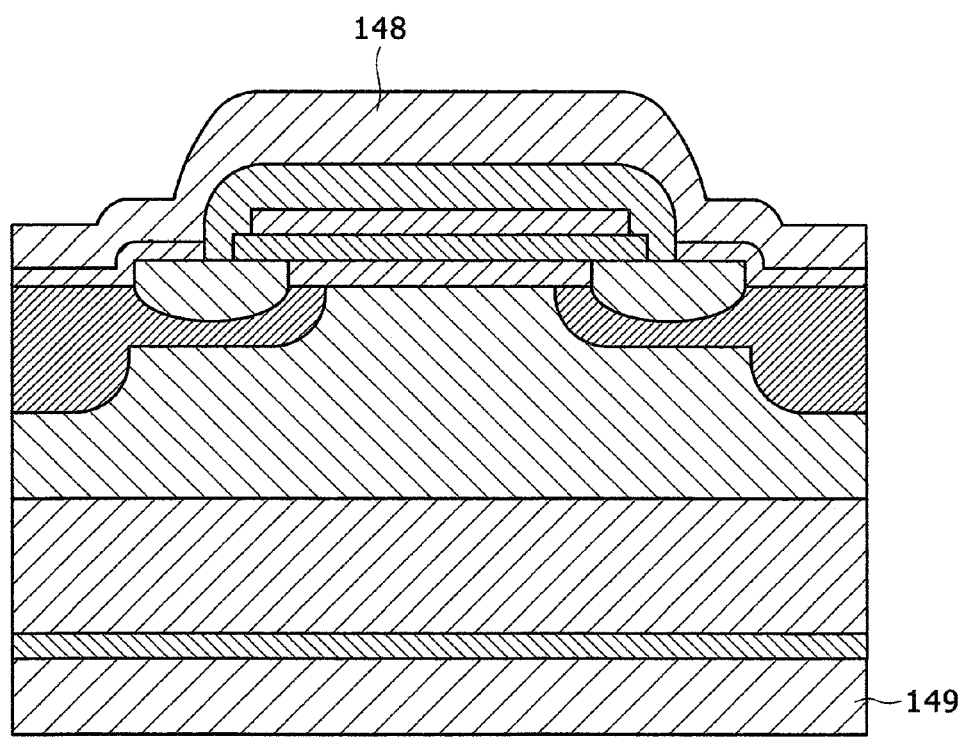
FIG. 13G is a cross sectional view showing a manufacturing process of the MOSFET of the fourth embodiment.

Next, as shown in FIG. 12G, a gate oxidized film 138 was formed. Dry oxidation was employed as an oxidation method, and the temperature of oxidation was 1250° C. The thickness of the gate oxidized film 138 was 50 nm. After the gate oxidation, a heating process was performed for the substrates 131 at 1150° C. for 10 minutes in a nitric monoxide atmosphere. It has been found out that the heating process allows the interface state density to be decreased and the channel mobility to be improved. Next, a polysilicon film 139 as shown in FIG. 12H was formed, and was processed by an ordinary reactive dry etching method to form a gate electrode 140 as shown in FIG. 13A. When unnecessary portions of the gate oxidized film were removed by etching with a pattern surrounding the gate electrode, a MOSFET gate oxidized film 141 was left as shown in FIG. 13B. As shown FIG. 13C, a silicon dioxide film 142 was formed by a plasma CVD method and the gate electrode except a film 143 was removed by etching, resulting in the state as shown in FIG. 13D. Continuously, nickel films 144 and 145 were formed on the front and back surfaces of the substrate by a sputtering method, as shown in FIG. 13E. In this state, a heating process was performed at 900° C. for three minutes in an argon atmosphere, films 146 and 147 primarily including nickel silicide were formed at portions where the monocrystalline silicon carbide substrate 131 and the silicon carbide epitaxial layer 134 were brought into contact with the nickel films 144 and 145, and the unreacted nickel films 144 and 145 were removed, resulting in the state as shown in FIG. 13F. The unreacted nickel films 144 and 145 were selectively removed using a sulfuric acid-hydrogen peroxide solution mixture. After a certain period of time, a source electrode 148 made of aluminum was formed on the front surface side and a drain electrode 149 made of nickel was formed on the back surface side, resulting in the state as shown in FIG. 13G. Although not shown in the drawing, a contact hole was provided on the gate electrode 140, and was coupled to a gate electrode pad made of aluminum.

Figure 14:
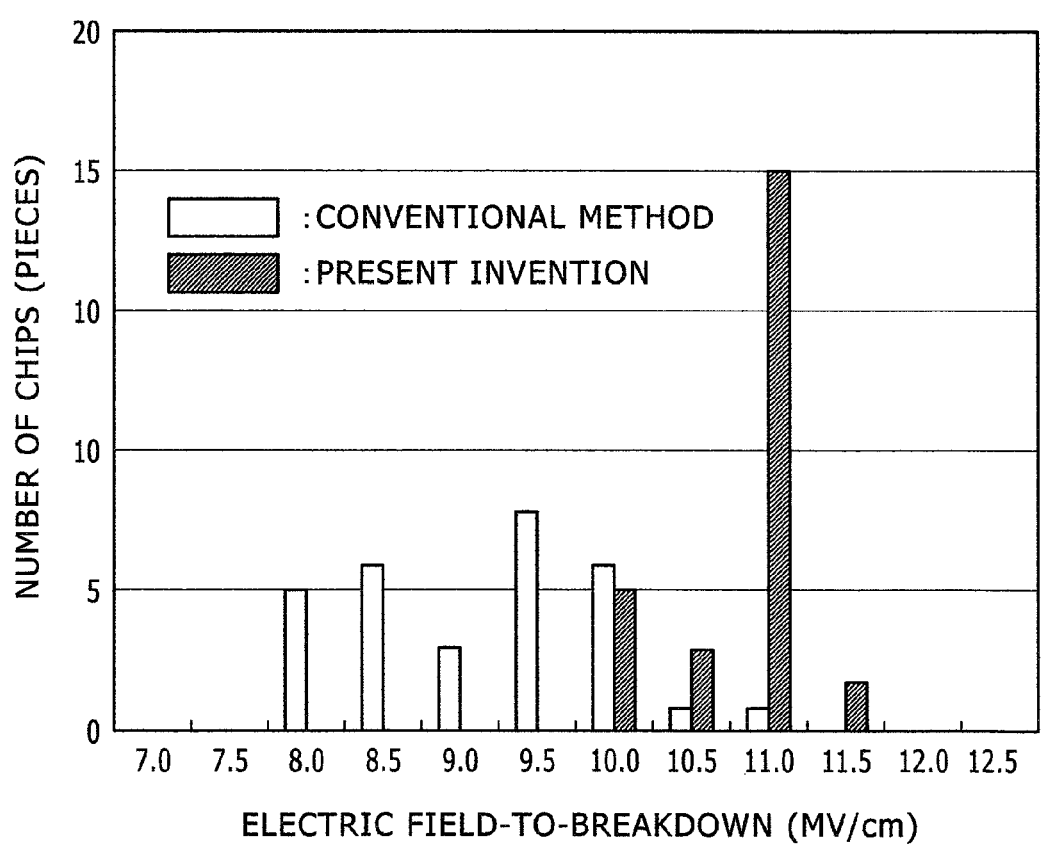
FIG. 14 is a diagram showing a result of reliability evaluation of a gate insulating film produced in accordance with the present invention and a conventional method.
Figure 15:
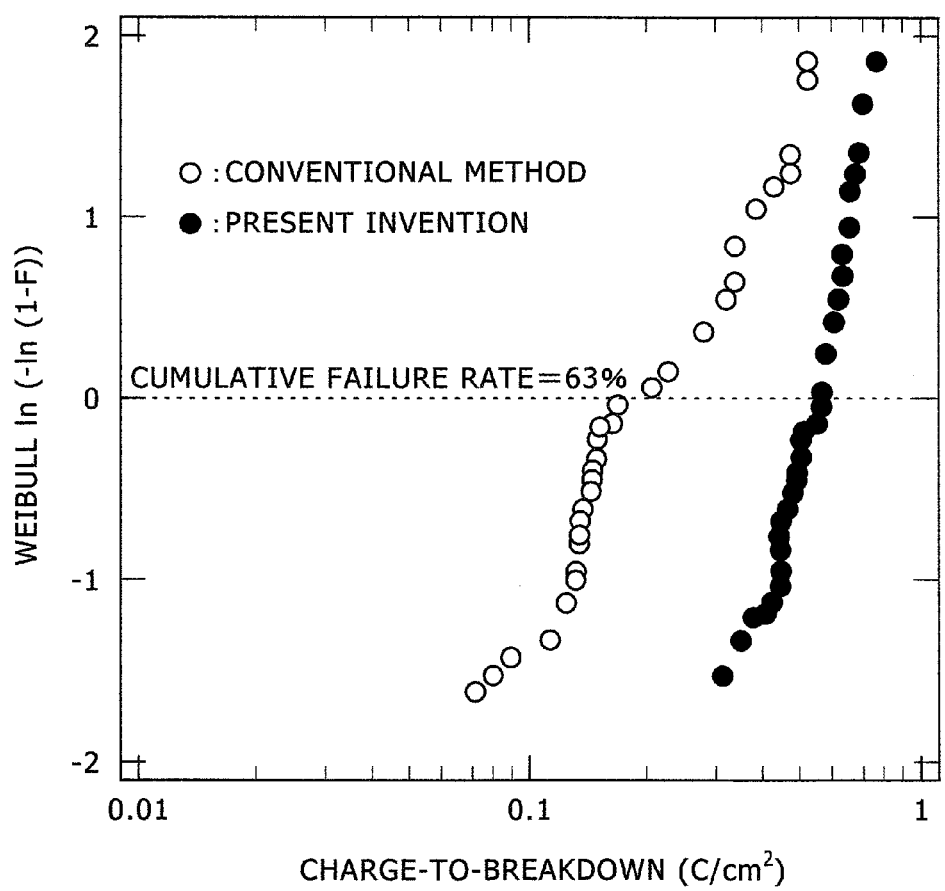
FIG. 15 is a diagram showing a result of reliability evaluation of the gate insulating film produced in accordance with the present invention and the conventional method.

The characteristics and reliability of the MOSFET produced in the above-described manner were evaluated. The MOSFET on the substrate to which the metal contamination removal process of the present invention was applied and the MOSFET on the substrate on which the conventional method was applied were compared to each other. The chip dimension of each MOSFET was 5.2 mm by 5.2 mm, and the dimension of the active area was 5.0 mm by 5.0 mm. In the first place, the breakdown voltage was examined. When the MOSFET with a breakdown voltage of more than 1200V was assumed as non-defective, the yield rate of the MOSFET according to the manufacturing method of the present invention was 77%. The yield rate of the MOSFET according to the conventional manufacturing method was 39%. It is conceivable that by applying the metal contamination removal process of the present invention before the epitaxial growth, the density of crucial defects contained in the epitaxial layer was decreased, and the yield rate in breakdown voltage was improved. The channel mobility of the MOSFET was the same in the present invention and the conventional method, and was about 60 cm$^2$/Vs at the most. Next, in order to evaluate the reliability of the gate insulating film, 30 chips of MOSFETs according to each of the present invention and the conventional method were measured on TZDB (Time Zero Dielectric Breakdown) and TDDB (Time Dependent Dielectric Breakdown). The results are shown in FIGS. 14 and 15. As for TZDB, all of the MOSFETs according to the present invention exhibited an electric field-to-breakdown as high as 10.0 MV/cm or more. On the contrary, a considerably-large number of MOSFET chips according to conventional method exhibited an electric field-to-breakdown as low as 9.0 MV/cm or less. When the results of TDDB measured at a stress electric field of 9.5 MV/cm were compared to each other in terms of charge-to-breakdown where a cumulative failure rate reached 63%, each MOSFET of the present invention was 0.6 C/cm$^2$ which was about four times the MOSFET according to the conventional method.

This reflects on that many of the MOSFETs according to the conventional method were led to the dielectric breakdown with a stress for a relatively short period. It is conceivable that by applying the metal contamination removal process of the present invention before the gate oxidation, the reliability of the gate oxidized film was improved, and improvement of the electric field-to-breakdown of TZDB and the lifetime of TDDB were achieved.

It should be noted that in place of the (0001) plane used in the fourth embodiment, a substrate with a (000-1) plane or a (11-20) plane may be used. Further, the off-angle is not limited to 4°, but may be in the range of about 0 to 8°.

Furthermore, the diameter and thickness of the substrate may be other dimensions. Even if these substrates are used, the same effect as the present invention can be obtained.

Fifth Embodiment

Figure 16A:
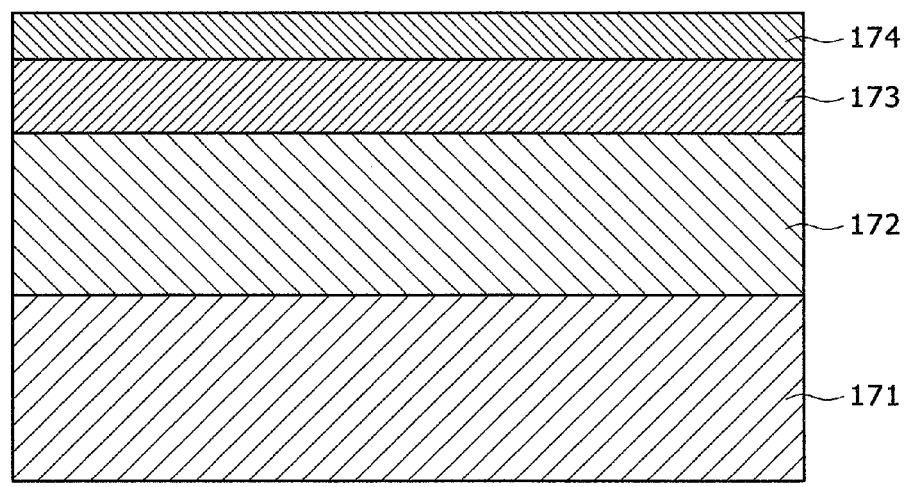
FIG. 16A is a cross sectional view showing a manufacturing process of a trench-type MOSFET of a fifth embodiment.
Figure 16B:
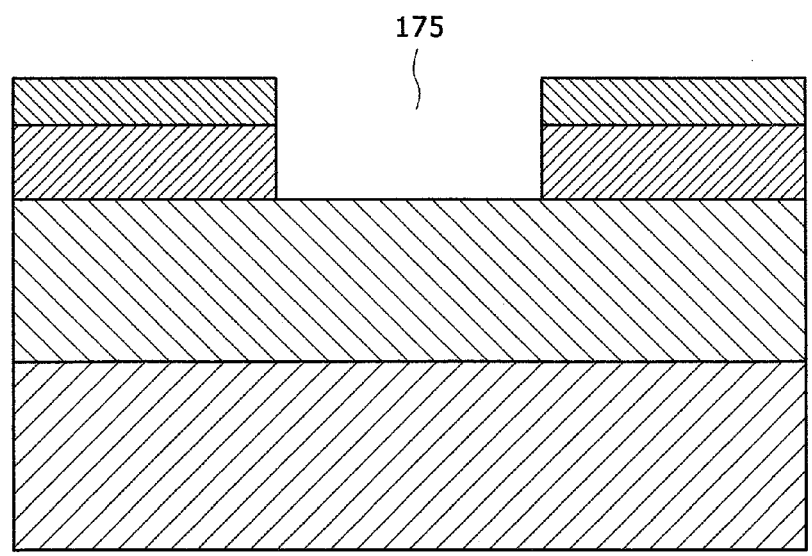
FIG. 16B is a cross sectional view showing a manufacturing process of the trench-type MOSFET of the fifth embodiment.
Figure 16C:
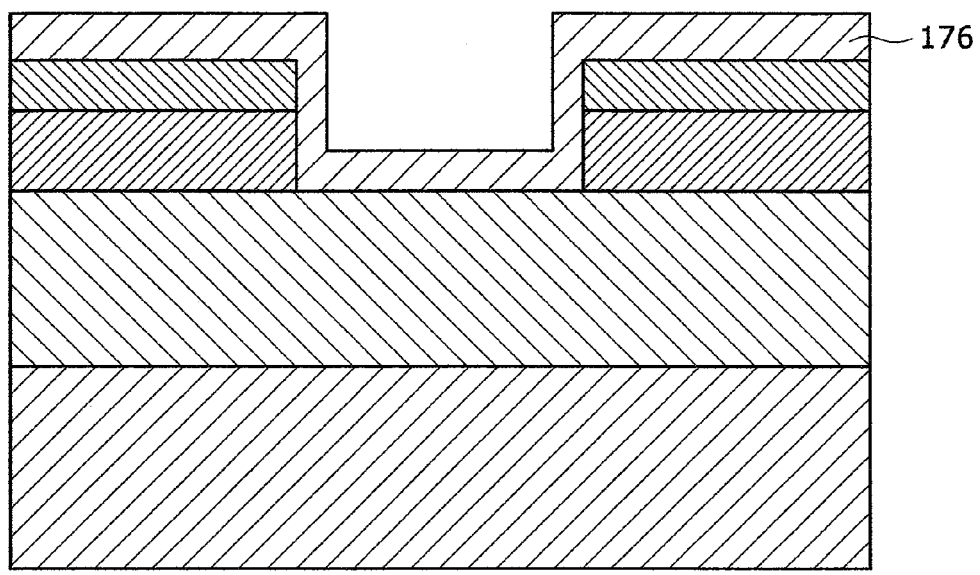
FIG. 16C is a cross sectional view showing a manufacturing process of the trench-type MOSFET of the fifth embodiment.
Figure 16D:
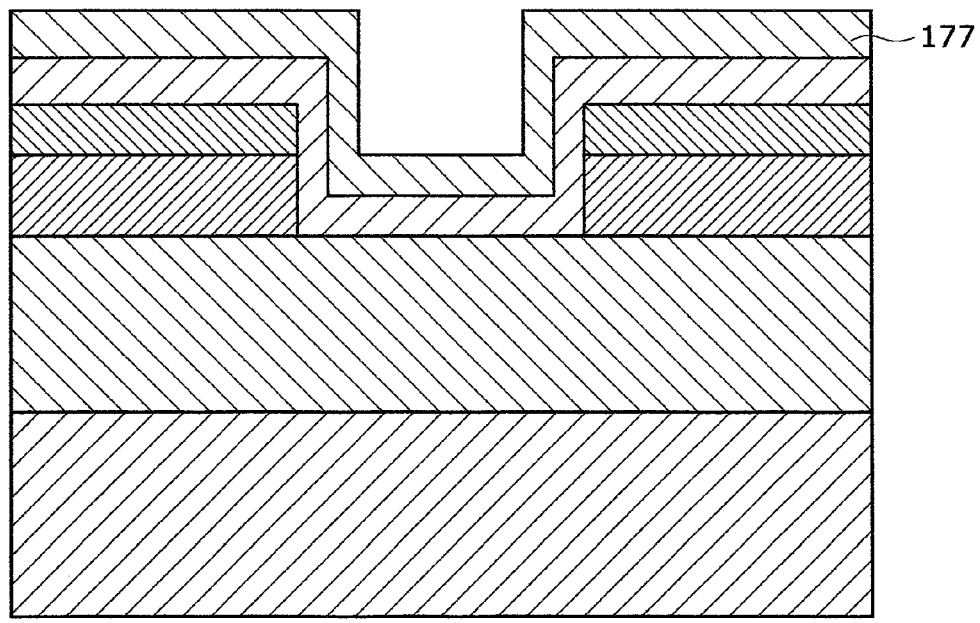
FIG. 16D is a cross sectional view showing a manufacturing process of the trench-type MOSFET of the fifth embodiment.

A fifth embodiment will be described using FIGS. 16A to 16G and FIGS. 17A to 17E. The fifth embodiment is an embodiment in which the present invention was applied to manufacturing of a trench-type MOSFET. Each of FIGS. 16A to 16G, and FIGS. 17A to 17E is cross sectional view showing a manufacturing process of the MOSFET of the fifth embodiment. A monocrystalline silicon carbide substrate 171 as shown in FIG. 16A was prepared. The monocrystalline silicon carbide substrate 171 was a 4H—SiC 4° off monocrystalline silicon carbide substrate with 4° off-angle inclined toward [11-20]. The diameter thereof was 100 mm at the most, and the thickness thereof was 380 µm. The front surface was a (0001) plane. A drift layer 172 having a thickness of 7 µm was formed on a surface of the substrate 171. The substrate 171 was an n$^+$ substrate, and the drift layer 172 was an n$^-$ substrate with an impurity concentration of $1\times10^{16}$ cm$^{-3}$. On the drift layer 172, there were formed a p-type base layer 173 having a thickness of 1 µm and an impurity concentration of $1\times10^{17}$ cm$^{-3}$ and an n$^+$-type source layer 174 having a thickness of 0.5 µm and an impurity concentration of $1\times10^{19}$ cm$^{-3}$. These layers were formed by epitaxial growth. However, at least a part of the layers can be formed by ion implantation. In this case, after ion implantation, an activation heating process, as similar to the third and fourth embodiments, is performed for the substrate 171. Next, a trench 175 as shown in FIG. 16B was formed. The trench 175 was formed by a dry etching method. The system used for etching was a high-density plasma etching system using ICP (Inductively Coupled Plasma). Sulfur hexafluoride was used for an etching gas and silicon dioxide was used as a mask. However, use of a mixture gas obtained by adding oxygen to sulfur hexafluoride, or a mixture gas of chlorine and oxygen enables the same process. After silicon dioxide as a mask was removed in a hydrofluoric acid aqueous solution, the metal contamination removal process of the present invention was applied to the substrate 171. In the first place, an oxidation process using ozone was performed. An oxidation furnace was used for the process. On the substrate 171 whose temperature was maintained at 700° C., ozone with a volume concentration of about 50% was supplied from a high-concentration ozone generator to oxidize the surface of the substrate 171. The oxidation suing ozone was applied in the fifth embodiment, but the same effect can be obtained by an oxygen plasma process as similar to the second embodiment. The oxidized film may be formed by other methods such as thermal oxidation such as dry oxidation, wet oxidation, and ISSG (In-situ Steam Generation) oxidation, and anode oxidation. It is preferable that an oxidation temperature and an oxidation duration are adjusted in accordance with each method, so as to allow the thickness of the film primarily including silicon dioxide formed on the surface of the monocrystalline silicon carbide substrate 171 to be less than 5 nm. After a certain period of time, the wet-chemical cleaning in each of aqua regia, a sulfuric acid-hydrogen peroxide solution mixture, a hydrofluoric acid aqueous solution, and an ammonia-hydrogen peroxide solution mixture was performed for the substrate again. The components of the chemical liquid used and the cleaning conditions were the same as those in the cleaning of the monocrystalline silicon carbide substrate according to the second embodiment of the present invention. Next, as shown in FIG. 16C, a first gate insulating film 176 was formed. The first gate insulating film 176 is a thin thermal-oxidation film having a thickness of 7 nm, on which, as shown in FIG. 16D, a thick CVD film 177 serving as a second gate insulating film was deposited. The thermal-oxidation film 176 of the fifth embodiment was formed by dry oxidation at 1300° C. The CVD film 177 was formed by a decompression CVD method using TEOS (Tetra Ethyl Ortho Silicate) and oxygen. The temperature of the substrate 171 at the time of forming the CVD film was 700° C. After forming the deposited gate insulating films 176 and 177, a heating process was performed at 1200° C. for five minutes in a nitric monoxide atmosphere. The total thickness of the gate insulating films 176 and 177 after the heating process was 55 nm. The gate insulating films 176 and 177 of the fifth embodiment were produced by the above-described method, but the formation method of the gate insulating films 176 and 177 is not limited to this. For example, the following method can be used. That is, by using a preliminarily-prepared film obtained by oxidizing an amorphous silicon film or a polysilicon film in place of the thermal oxidation film, a CVD film similar to that of the fifth embodiment is deposited thereon. In the case of using an amorphous silicon film or a polysilicon film, the metal contamination removal process of the present invention similar to the fifth embodiment is applied before the formation of an amorphous silicon film or a polysilicon film.

Figure 16E:
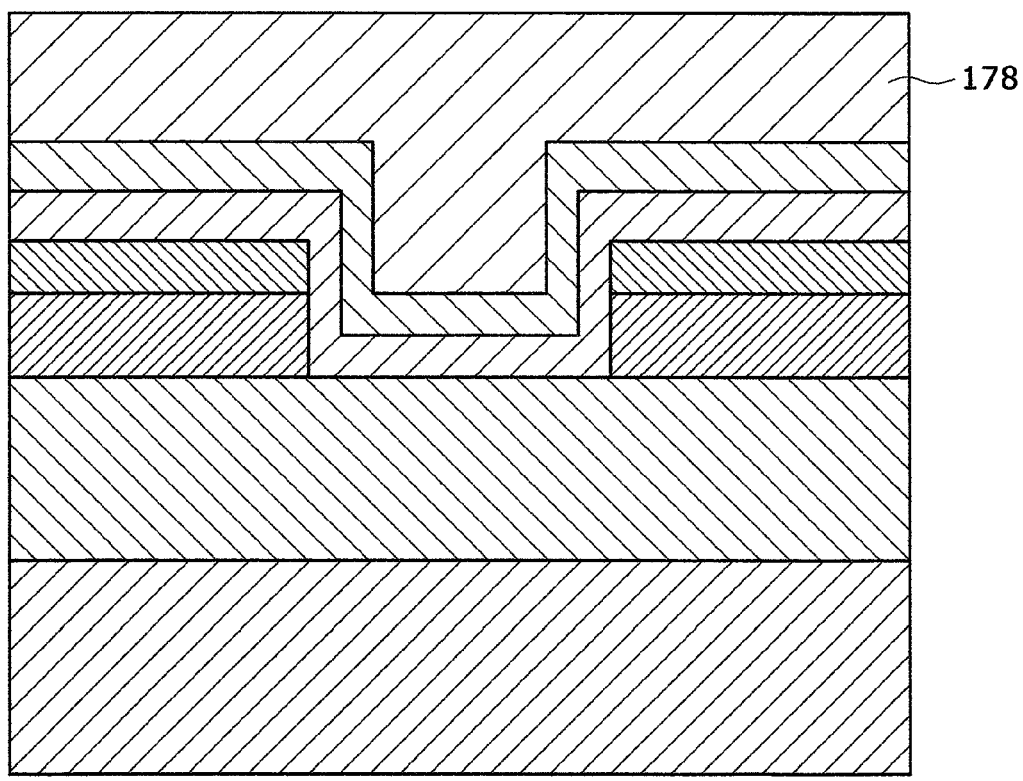
FIG. 16E is a cross sectional view showing a manufacturing process of the trench-type MOSFET of the fifth embodiment.
Figure 16F:
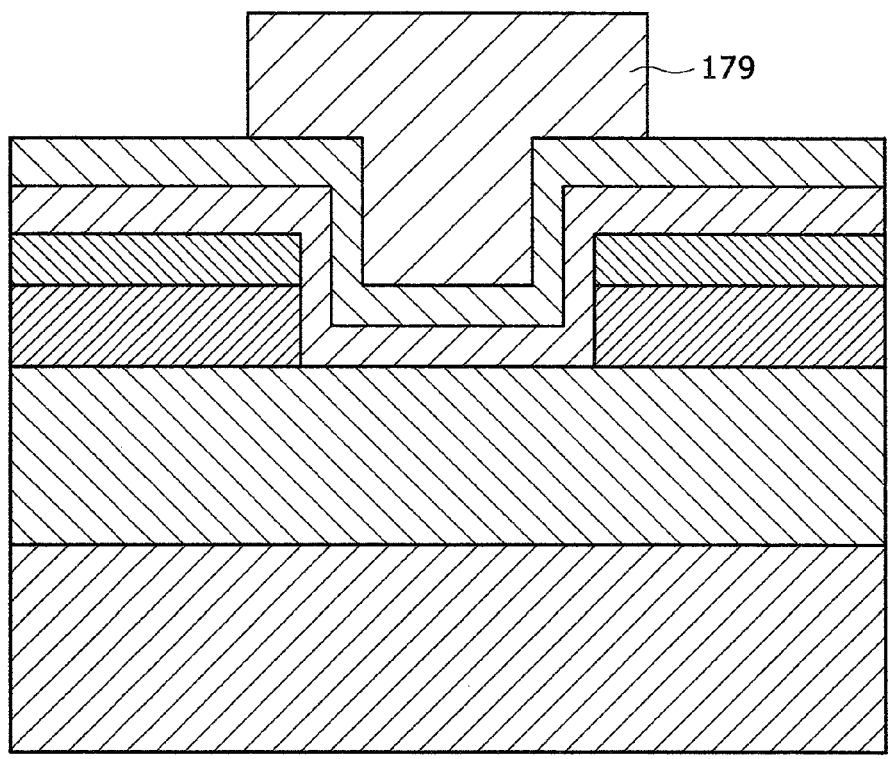
FIG. 16F is a cross sectional view showing a manufacturing process of the trench-type MOSFET of the fifth embodiment.
Figure 16G:
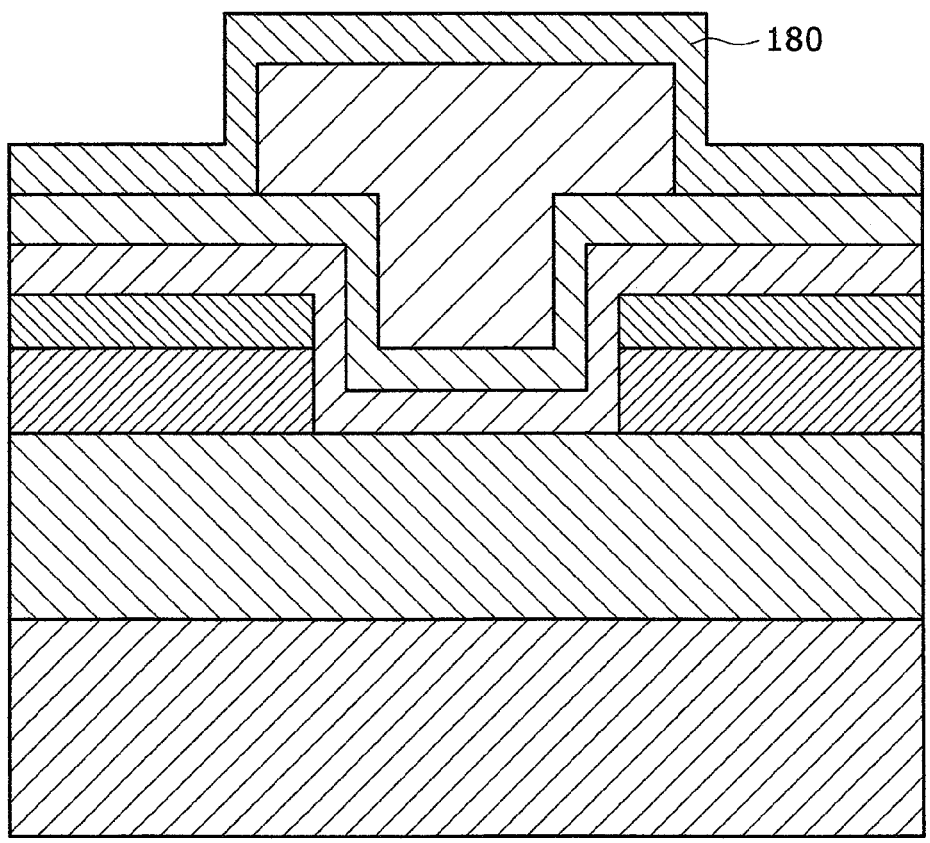
FIG. 16G is a cross sectional view showing a manufacturing process of the trench-type MOSFET of the fifth embodiment.
Figure 17A:
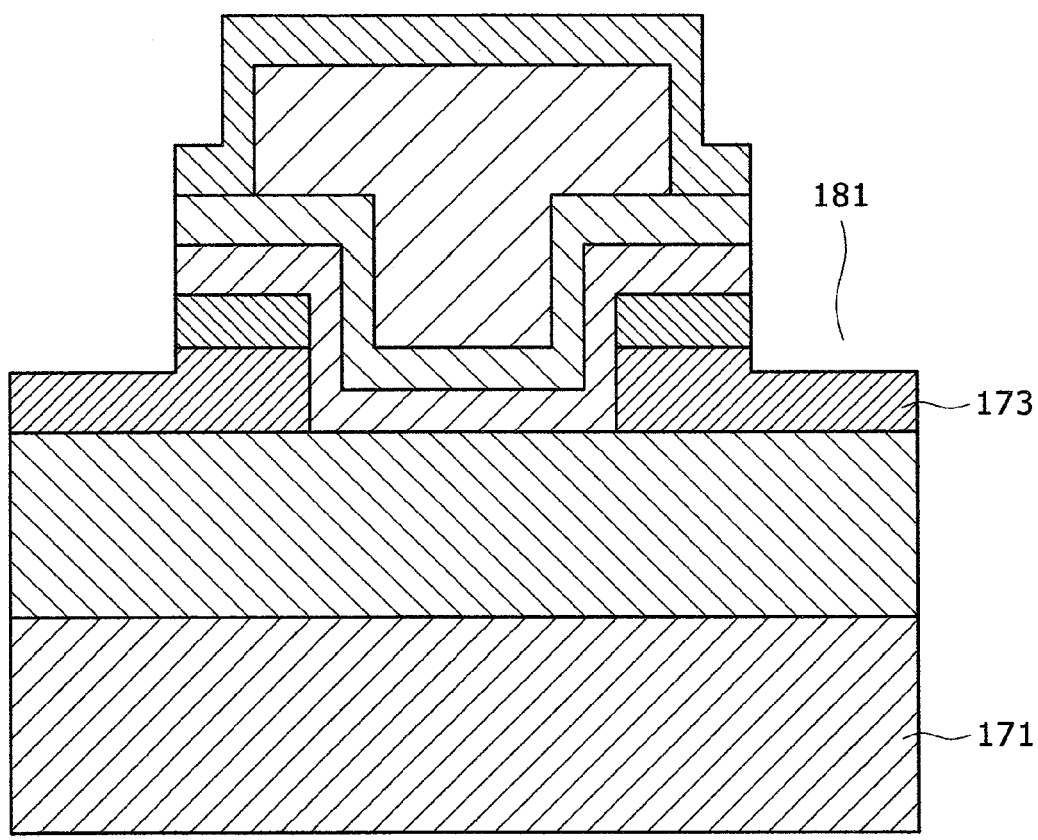
FIG. 17A is a cross sectional view showing a manufacturing process of the trench-type MOSFET of the fifth embodiment.
Figure 17B:
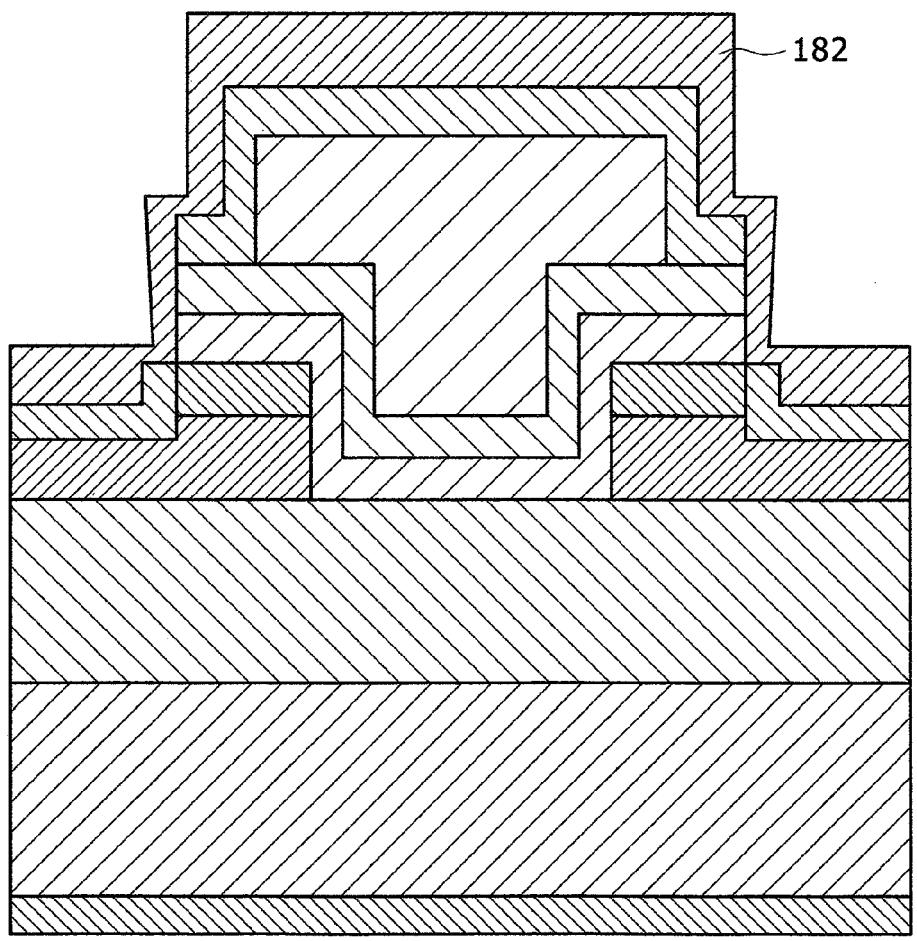
FIG. 17B is a cross sectional view showing a manufacturing process of the trench-type MOSFET of the fifth embodiment.
Figure 17C:
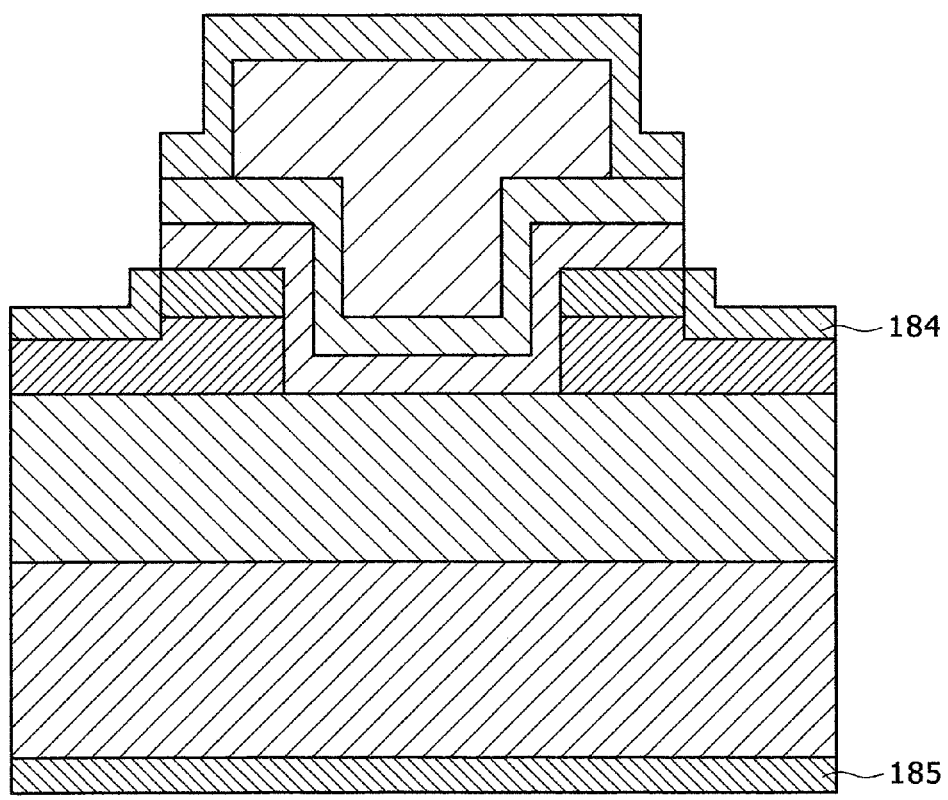
FIG. 17C is a cross sectional view showing a manufacturing process of the trench-type MOSFET of the fifth embodiment.
Figure 17D:
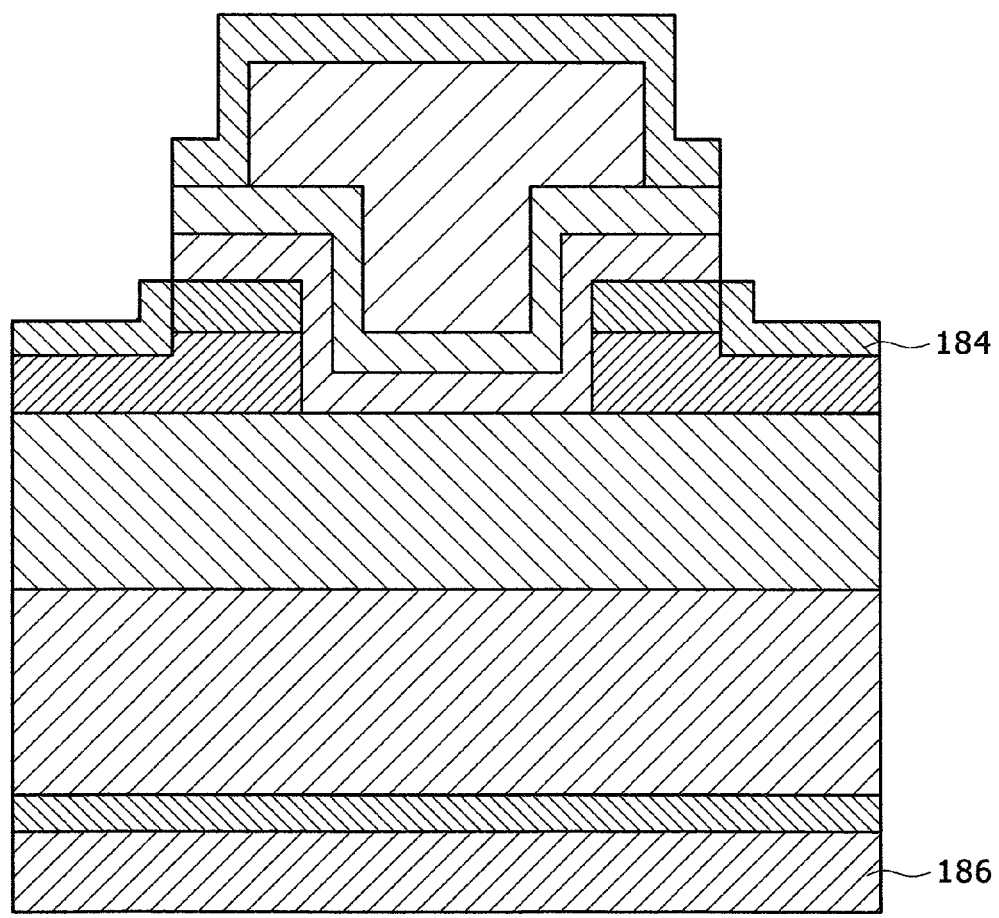
FIG. 17D is a cross sectional view showing a manufacturing process of the trench-type MOSFET of the fifth embodiment.
Figure 17E:
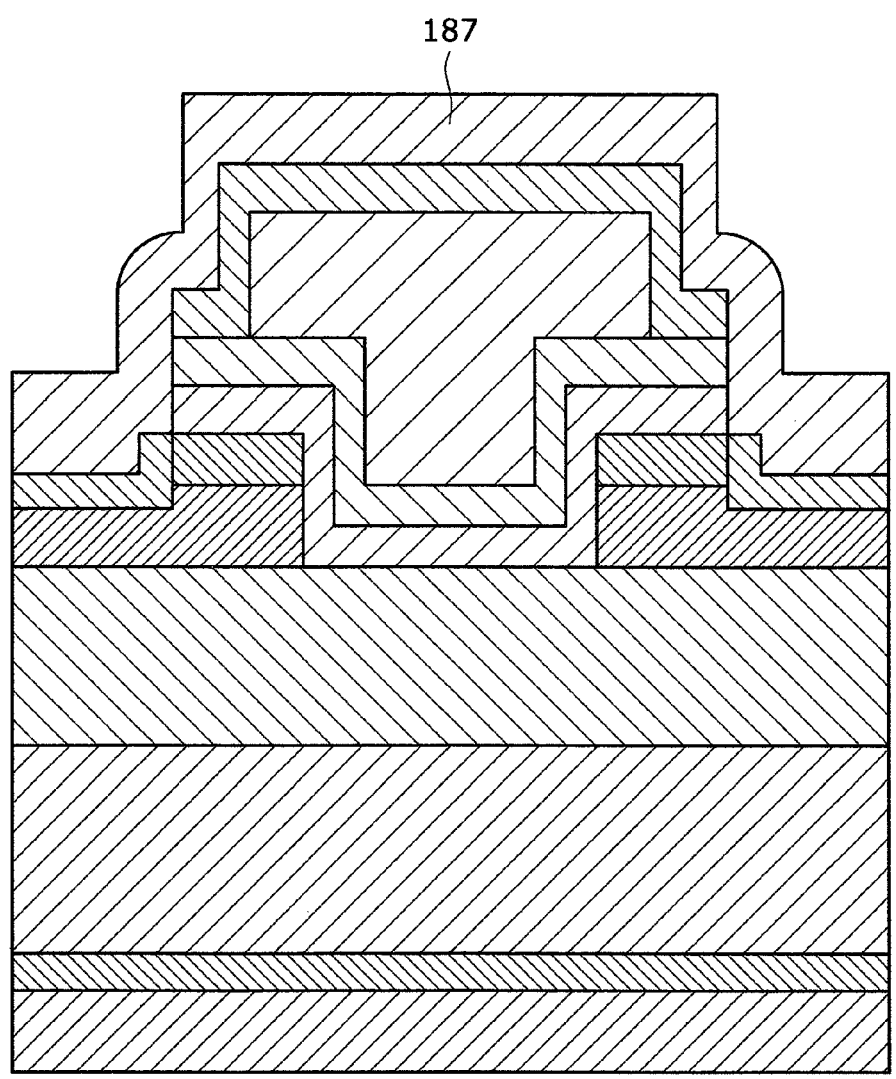
FIG. 17E is a cross sectional view showing a manufacturing process of the trench-type MOSFET of the fifth embodiment.

Next, as shown in FIG. 16E, when a boron-doped polysilicon film 178 was formed and patterned, a gate electrode 179 as shown in FIG. 16F was formed. Further, a silicon dioxide film 180 serving as an interlayer insulating film was formed by a plasma CVD method using TEOS and oxygen, resulting in the state as shown in FIG. 16G. Portions 181 on the both sides of the trench were etched until the p-type base layer 173 of the surface of the monocrystalline silicon carbide substrate 171 was exposed, resulting in the state as shown in FIG. 17A. Both of the etching using silicon dioxide and the etching using silicon carbide were performed by a dry etching method. Next, nickel films 182 and 183 were formed on the front and back surfaces of the substrate 171 by a sputtering method, and a heating process was performed at 1000° C. for one minute in an argon atmosphere by using an RTA system. Unreacted nickel was removed in a sulfuric acid-hydrogen peroxide solution mixture, resulting in the state as shown in FIG. 17C. Layers 184 and 185 primarily including nickel silicide were formed on a portion on the front surface where the p-type base layer was exposed and the back surface, respectively. After a nickel film 186 serving as a drain electrode was additionally formed on the back surface by the sputtering method, an aluminum film 187 serving as a source electrode was formed by the spattering method, as shown in FIG. 17E. Although not shown in the drawing, a contact hole was formed on the gate electrode 179, and was coupled to a gate electrode pad made of aluminum.

The current-voltage characteristics of the trench-type MOSFET produced in the above-described manner were evaluated. The MOSFET on the substrate to which the metal contamination removal process of the present invention was applied and the MOSFET on the substrate according to the conventional method were compared to each other. The chip dimension of each MOSFET was 4.2 mm by 4.2 mm, and the dimension of the active area was 4.0 mm by 4.0 mm. The yield rate of the MOSFET according to method of the present invention was 63%, which was considerably improved as compared to 35% that was the yield rate of the MOSFET according to the conventional method. It is conceivable that by applying the metal contamination removal process before forming the gate oxidized film and after processing the trench, the density of crucial defects contained in the gate oxidized film was reduced, and the yield rate of the MOSFET was improved. As similar to the fourth embodiment, TZDB and TDDB for the MOSFET according to the method of the present invention and the MOSFET according to the conventional method were measured. As a result, the MOSFET of the present invention exhibited a higher electric field-to-breakdown than the MOSFET of the conventional method, as similar to the fourth embodiment. Further, the charge-to-breakdown of the MOSFET of the present invention where the cumulative failure rate reached 63% was about five times that of the MOSFET according to the conventional method. It is conceivable that by applying the metal contamination removal process of the present invention before forming the gate oxidized film and after processing the trench, the reliability of the gate oxidized film was improved, and the improvement of the electric field-to-breakdown of TZDB and the lifetime of TDDB was achieved.

Since the dry etching system generally uses plasma of reactive gas, it is difficult to maintain cleanliness. Thus, it is difficult to eliminate the metal contamination that is transferred from the dry etching system to the substrate during etching. Therefore, the metal contamination likely to exist on the surface of the substrate after processing the trench. It is conceivable that the metal contamination removal process of the present invention was advantageous in improving the yield rate and the reliability of the trench-type MOSFET due to removal of the metal contamination in this stage.

Although the trench-type MOSFET has been described in the fifth embodiment, a trench-type junction FET is also effective in improving the yield rate and reliability as similar to the MOSFET. It should be noted that in place of the (0001) plane used in the second embodiment, a substrate with a (000-1) plane or a (11-20) plane may be used. Further, the off-angle is not limited to 4°, but may be in the range of about 0 to 8°. Furthermore, the diameter and thickness of the substrate may be other dimensions. Even if these substrates are used, the same effect as the present invention can be obtained.

What is claimed is:

1. A manufacturing method of a semiconductor device, comprising:
   preparing a monocrystalline silicon carbide substrate having a drift layer;
   performing ion-implantation on a front surface of the monocrystalline silicon carbide substrate;
   forming a first carbon film on a back surface of the monocrystalline silicon carbide substrate;
   forming a second carbon film on the front surface of the monocrystalline silicon carbide substrate; and
   performing activation annealing of the ion-implanted monocrystalline silicon carbide substrate,
   wherein the first and second carbon films are each formed on the monocrystalline silicon carbide substrate prior to said activation annealing, and
   wherein said first and second carbon films disposed on both surfaces of the monocrystalline silicon carbide substrate are maintained during said activation annealing.

2. The manufacturing method of a semiconductor device of claim 1,
   wherein said first and second carbon films each have a thickness of about 100 nm.

3. The manufacturing method of a semiconductor device of claim 1,
   wherein said activation annealing is performed at 1800° C. in a vacuum for about 1 minute.

4. The manufacturing method of a semiconductor device of claim 1,
   wherein said monocrystalline silicon carbide substrate is a 4H—SiC(0001)Si-face substrate with an about 0 to 8 degree off angle toward [112-0].

5. The manufacturing method of a semiconductor device of claim 4,
   wherein said monocrystalline silicon carbide substrate is the 4H—SiC(0001)Si-face substrate with a 4 degree off angle toward [112-0].

6. The manufacturing method of a semiconductor device of claim 1,
   wherein said front surface of said monocrystalline silicon carbide substrate is one of a (0001) plane, a (000-1) plane, and a (11-20) plane.

7. The manufacturing method of a semiconductor device of claim 1, further comprising:
   prior to said activation annealing, forming an n-type drift layer on a front surface of said monocrystalline silicon carbide substrate;
   forming a first p-type doped layer using ion implantation of Al on a part of a surface of the n-type drift layer; and
   forming a second, high-concentration p-type doped layer on using ion implantation of Al on a surface of the first p-type doped layer.

8. The manufacturing method of a semiconductor device of claim 7,
   wherein said n-type drift layer has a thickness of about 20 μm,
   wherein said first p-type doped layer has a thickness of about 1 μm, and
   wherein said second, high-concentration p-type doped layer has a thickness of about 0.1 μm.

9. A manufacturing method of a semiconductor device, comprising:
   forming an n-type drift layer on a front surface of a monocrystalline silicon carbide substrate;
   forming a first p-type doped layer using ion implantation of Al on a part of a surface of the n-type drift layer;
   forming a second, high-concentration p-type doped layer on using ion implantation of Al on a surface of the first p-type doped layer;
   forming a first carbon film on a back surface of the monocrystalline silicon carbide substrate;
   forming a second carbon film on exposed portions of said n-type drift layer, said first p-type doped layer, and said second, high-concentration p-type doped layer at a front surface of the monocrystalline silicon carbide substrate; and
   performing activation annealing of said monocrystalline silicon carbide substrate,
   wherein the first and second carbon films are each formed on the monocrystalline silicon carbide substrate prior to said activation annealing, and
   wherein said first and second carbon films disposed on both surfaces of the monocrystalline silicon carbide substrate are maintained during said activation annealing.

10. The manufacturing method of a semiconductor device of claim 9,
    wherein said first and second carbon films each have a thickness of about 100 nm, wherein said n-type drift layer has a thickness of about 20 μm, wherein said first p-type doped layer has a thickness of about 1 μm, and wherein said second, high-concentration p-type doped layer has a thickness of about 0.1 μm.

11. The manufacturing method of a semiconductor device of claim 9, wherein said activation annealing is performed at 1800° C. in a vacuum for about 1 minute.

12. The manufacturing method of a semiconductor device of claim 9, wherein said monocrystalline silicon carbide substrate is a 4H—SiC(0001)Si-face substrate with an about 0 to 8 degree off angle toward [112-0].

13. The manufacturing method of a semiconductor device of claim 12, wherein said monocrystalline silicon carbide substrate is the 4H—SiC(0001)Si-face substrate with a 4 degree off angle toward [112-0].

14. The manufacturing method of a semiconductor device of claim 9, wherein said front surface of said monocrystalline silicon carbide substrate is one of a (0001) plane, a (000-1) plane, and a (11-20) plane.

* * * * *